(12) United States Patent
Gaalema et al.

(10) Patent No.: US 11,774,561 B2
(45) Date of Patent: Oct. 3, 2023

(54) AMPLIFIER INPUT PROTECTION CIRCUITS

(71) Applicant: Luminar Technologies, Inc., Orlando, FL (US)

(72) Inventors: Stephen D. Gaalema, Colorado Springs, CO (US); Robert D. Still, Colorado Springs, CO (US)

(73) Assignee: Luminar Technologies, Inc., Orlando, FL (US)

( * ) Notice: Subject to any disclaimer, the term of this patent is extended or adjusted under 35 U.S.C. 154(b) by 1184 days.

(21) Appl. No.: 16/271,119

(22) Filed: Feb. 8, 2019

(65) Prior Publication Data

US 2020/0256961 A1 Aug. 13, 2020

(51) Int. Cl.
| | | |
|---|---|---|
| G01S 7/48 | (2006.01) | |
| G01S 7/4861 | (2020.01) | |
| G01N 21/55 | (2014.01) | |
| G01S 17/89 | (2020.01) | |
| G01S 17/10 | (2020.01) | |
| H02H 1/00 | (2006.01) | |
| H03F 1/56 | (2006.01) | |

(52) U.S. Cl.
CPC ............ *G01S 7/4861* (2013.01); *G01N 21/55* (2013.01); *G01S 17/10* (2013.01); *G01S 17/89* (2013.01); *H02H 1/00* (2013.01); *H03F 1/56* (2013.01)

(58) Field of Classification Search
CPC ..................................................... G01S 7/4861
See application file for complete search history.

(56) References Cited

U.S. PATENT DOCUMENTS

| | | | |
|---|---|---|---|
| 5,006,721 A | | 4/1991 | Cameron et al. |
| 5,696,657 A | * | 12/1997 | Nourrcier, Jr. ........ G01S 7/4861 |
| | | | 361/115 |
| 6,449,384 B2 | | 9/2002 | Laumeyer et al. |
| 6,710,324 B2 | | 3/2004 | Hipp |
| 6,723,975 B2 | | 4/2004 | Saccomanno |
| 6,747,747 B2 | | 6/2004 | Hipp |
| 6,759,649 B2 | | 7/2004 | Hipp |
| 7,092,548 B2 | | 5/2006 | Laumeyer et al. |
| 7,209,221 B2 | | 4/2007 | Breed et al. |
| 7,345,271 B2 | | 3/2008 | Boehlau et al. |
| 7,443,903 B2 | | 10/2008 | Leonardo et al. |
| 7,532,311 B2 | | 5/2009 | Henderson et al. |
| 7,570,793 B2 | | 8/2009 | Lages et al. |
| 7,583,364 B1 | | 9/2009 | Mayor et al. |

(Continued)

FOREIGN PATENT DOCUMENTS

| | | |
|---|---|---|
| WO | 2008/128359 | 10/2008 |
| WO | 2013/087799 | 6/2013 |

OTHER PUBLICATIONS

International Search Report and Written Opinion for PCT/US2020/017200 dated Jun. 5, 2020.

*Primary Examiner* — Patricia T Nguyen

(57) ABSTRACT

Amplifier input protection circuits are described. In one embodiment, a photoreceiver for a lidar system has a photodetector configured to generate an output current in response to received light. A transimpedance amplifier is configured to receive the output current and generate a voltage output corresponding to the output current in response thereto, and a diode circuit has a cathode coupled at a node between the photodetector output and the transimpedance amplifier input.

21 Claims, 11 Drawing Sheets

(56) References Cited

U.S. PATENT DOCUMENTS

| | | |
|---|---|---|
| 7,649,920 B2 | 1/2010 | Welford |
| 7,652,752 B2 | 1/2010 | Fetzer et al. |
| 7,839,491 B2 | 11/2010 | Harris et al. |
| 7,872,794 B1 | 1/2011 | Minelly et al. |
| 7,902,570 B2 | 3/2011 | Itzler et al. |
| 7,945,408 B2 | 5/2011 | Dimsdale et al. |
| 7,969,558 B2 | 6/2011 | Hall |
| 7,995,796 B2 | 8/2011 | Retterath et al. |
| 8,059,263 B2 | 11/2011 | Haberer et al. |
| 8,072,663 B2 | 12/2011 | O'Neill et al. |
| 8,081,301 B2 | 12/2011 | Stann et al. |
| 8,138,849 B2 | 3/2012 | West et al. |
| 8,279,420 B2 | 10/2012 | Ludwig et al. |
| 8,280,623 B2 | 10/2012 | Trepagnier et al. |
| 8,346,480 B2 | 1/2013 | Trepagnier et al. |
| 8,364,334 B2 | 1/2013 | Au et al. |
| 8,452,561 B2 | 5/2013 | Dimsdale et al. |
| 8,548,014 B2 | 10/2013 | Fermann et al. |
| 8,625,080 B2 | 1/2014 | Heizmann et al. |
| 8,675,181 B2 | 3/2014 | Hall |
| 8,723,955 B2 | 5/2014 | Kiehn et al. |
| 8,767,190 B2 | 7/2014 | Hall |
| 8,796,605 B2 | 8/2014 | Mordarski et al. |
| 8,836,922 B1 | 9/2014 | Pennecot et al. |
| 8,880,296 B2 | 11/2014 | Breed |
| 8,896,818 B2 | 11/2014 | Walsh et al. |
| 8,934,509 B2 | 1/2015 | Savage-Leuchs et al. |
| 9,000,347 B2 | 4/2015 | Woodward et al. |
| 9,041,136 B2 | 5/2015 | Chia |
| 9,048,370 B1 | 6/2015 | Urmson et al. |
| 9,063,549 B1 | 6/2015 | Pennecot et al. |
| 9,069,060 B1 | 6/2015 | Zbrozek et al. |
| 9,074,878 B2 | 7/2015 | Steffey et al. |
| 9,086,273 B1 | 7/2015 | Gruver et al. |
| 9,086,481 B1 | 7/2015 | Dowdall et al. |
| 9,091,754 B2 | 7/2015 | D'aligny |
| 9,103,669 B2 | 8/2015 | Giacotto et al. |
| 9,121,703 B1 | 9/2015 | Droz et al. |
| 9,160,140 B2 | 10/2015 | Gusev et al. |
| 9,170,333 B2 | 10/2015 | Mheen et al. |
| 9,199,641 B2 | 12/2015 | Ferguson et al. |
| 9,213,085 B2 | 12/2015 | Kanter |
| 9,239,260 B2 | 1/2016 | Bayha et al. |
| 9,246,041 B1 | 1/2016 | Clausen et al. |
| 9,285,464 B2 | 3/2016 | Pennecot et al. |
| 9,285,477 B1 | 3/2016 | Smith et al. |
| 9,297,901 B2 | 3/2016 | Bayha et al. |
| 9,299,731 B1 | 3/2016 | Lenius et al. |
| 9,304,154 B1 | 4/2016 | Droz et al. |
| 9,304,203 B1 | 4/2016 | Droz et al. |
| 9,304,316 B2 | 4/2016 | Weiss et al. |
| 9,310,471 B2 | 4/2016 | Sayyah et al. |
| 9,335,255 B2 | 5/2016 | Retterath et al. |
| 9,360,554 B2 | 6/2016 | Retterath et al. |
| 9,368,933 B1 | 6/2016 | Nijjar et al. |
| 9,383,201 B2 | 7/2016 | Jackman et al. |
| 9,383,445 B2 | 7/2016 | Lu et al. |
| 9,383,753 B1 | 7/2016 | Templeton et al. |
| 9,529,079 B1 * | 12/2016 | Droz .................. G01S 7/484 |
| RE46,672 E | 1/2018 | Hall |
| 10,826,268 B1 * | 11/2020 | Zamprogno .......... H01S 5/0428 |
| 11,530,947 B1 * | 12/2022 | Moore .................. G01J 1/46 |
| 2006/0066412 A1 | 3/2006 | Mohammadi |
| 2006/0290920 A1 | 12/2006 | Kampchen et al. |
| 2009/0079958 A1 * | 3/2009 | Gunther ................ G01S 17/04 |
| | | 356/5.01 |
| 2009/0189693 A1 | 7/2009 | Hanada et al. |
| 2009/0273770 A1 | 11/2009 | Bauhahn et al. |
| 2010/0034221 A1 | 2/2010 | Dragic |
| 2011/0286136 A1 | 11/2011 | Tsai |
| 2012/0227263 A1 | 9/2012 | Leclair et al. |
| 2013/0033742 A1 | 2/2013 | Rogers et al. |
| 2014/0111805 A1 | 4/2014 | Albert et al. |
| 2014/0168631 A1 | 6/2014 | Haslim et al. |
| 2014/0176933 A1 | 6/2014 | Haslim et al. |
| 2014/0211194 A1 | 7/2014 | Pacala et al. |
| 2014/0293263 A1 | 10/2014 | Justice et al. |
| 2014/0293266 A1 | 10/2014 | Hsu et al. |
| 2015/0070803 A1 | 3/2015 | Youssef et al. |
| 2015/0131080 A1 | 5/2015 | Retterath et al. |
| 2015/0177368 A1 | 6/2015 | Bayha et al. |
| 2015/0185244 A1 | 7/2015 | Inoue et al. |
| 2015/0185313 A1 | 7/2015 | Zhu |
| 2015/0192676 A1 | 7/2015 | Kotelnikov et al. |
| 2015/0192677 A1 | 7/2015 | Yu et al. |
| 2015/0204978 A1 | 7/2015 | Hammes et al. |
| 2015/0214690 A1 | 7/2015 | Savage-Leuchs et al. |
| 2015/0276921 A1 * | 10/2015 | Dunne .................... G01S 7/481 |
| | | 356/4.01 |
| 2015/0301182 A1 | 10/2015 | Geiger et al. |
| 2015/0323654 A1 | 11/2015 | Jachmann et al. |
| 2015/0378023 A1 | 12/2015 | Royo Royo et al. |
| 2015/0378241 A1 | 12/2015 | Eldada |
| 2016/0025842 A1 | 1/2016 | Anderson et al. |
| 2016/0047896 A1 | 2/2016 | Dussan |
| 2016/0047901 A1 | 2/2016 | Pacala et al. |
| 2016/0049765 A1 | 2/2016 | Eldada |
| 2016/0146939 A1 | 5/2016 | Shpunt et al. |
| 2016/0146940 A1 | 5/2016 | Koehler |
| 2016/0161600 A1 | 6/2016 | Eldada et al. |
| 2016/0245919 A1 | 8/2016 | Kalscheur et al. |
| 2017/0299721 A1 | 10/2017 | Eichenholz et al. |
| 2018/0284229 A1 * | 10/2018 | Liu ...................... H03G 3/3084 |

* cited by examiner

AMPLIFIER INPUT PROTECTION CIRCUITS

TECHNICAL FIELD

This disclosure generally relates to lidar systems and, more particularly, to a receiver within the lidar system that includes protection circuits for an amplifier coupled to a photodiode.

BACKGROUND

Light detection and ranging (lidar) is a technology that can be used to measure distances to remote targets. Typically, a lidar system includes a light source and an optical receiver. The light source can include, for example, a laser which emits light having a particular operating wavelength. The operating wavelength of a lidar system may lie, for example, in the infrared, visible, or ultraviolet portions of the electromagnetic spectrum. The light source emits light toward a target which scatters the light, and some of the scattered light is received back at the receiver. The system determines the distance to the target based on one or more characteristics associated with the received light. For example, the lidar system may determine the distance to the target based on the time of flight for a pulse of light emitted by the light source to travel to the target and back to the lidar system.

DESCRIPTION OF EXAMPLE EMBODIMENTS

Figure 1:
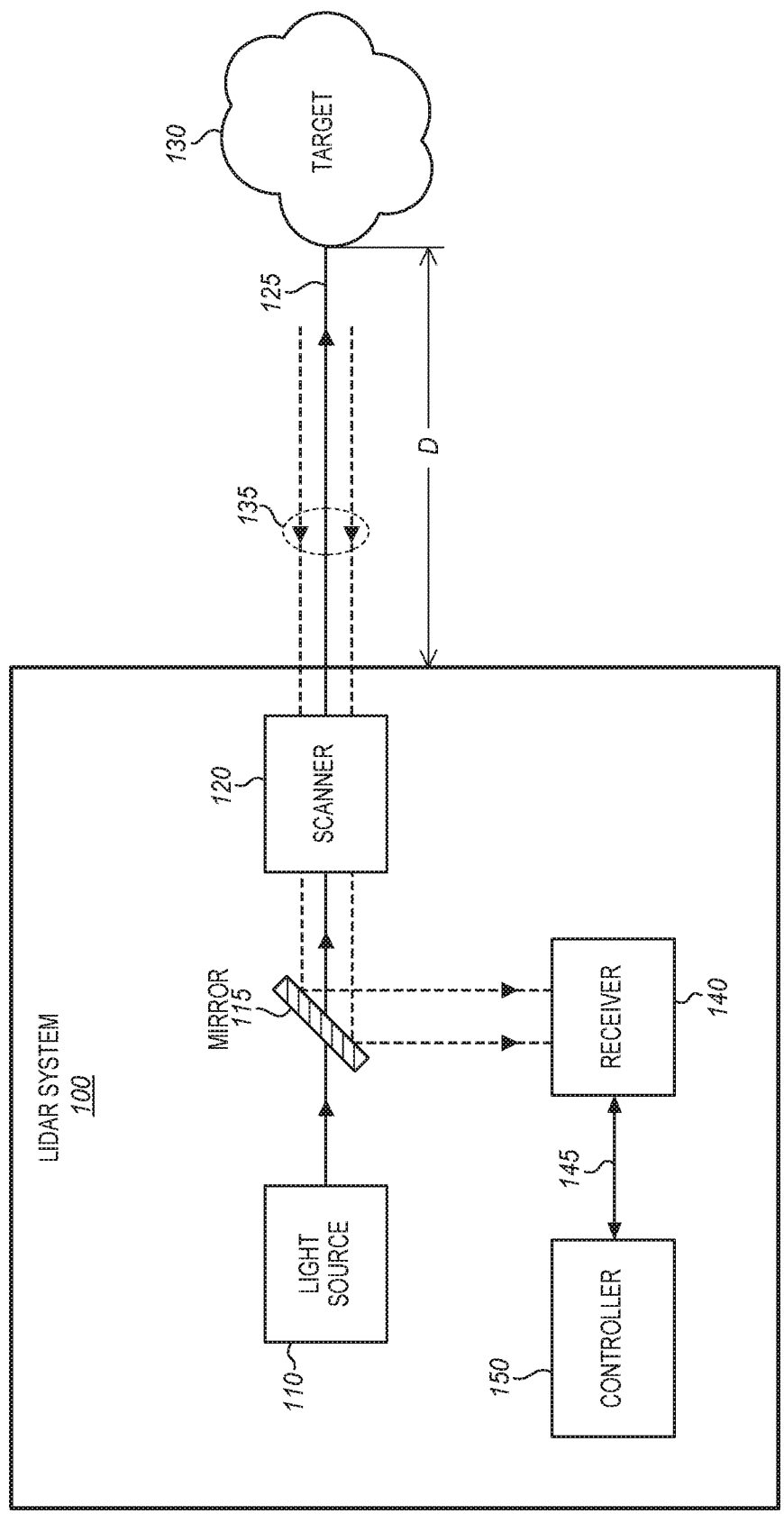
FIG. 1 illustrates an example light detection and ranging (lidar) system.

FIG. 1 illustrates an example light detection and ranging (lidar) system 100. In particular embodiments, a lidar system 100 may be referred to as a laser ranging system, a laser radar system, a LIDAR system, a lidar sensor, or a laser detection and ranging (LADAR or ladar) system. In particular embodiments, a lidar system 100 may include a light source 110, mirror 115, scanner 120, receiver 140, or controller 150. The light source 110 may include, for example, a laser which emits light having a particular operating wavelength in the infrared, visible, or ultraviolet portions of the electromagnetic spectrum. As an example, light source 110 may include a laser with an operating wavelength between approximately 900 nanometers (nm) and 2000 nm. The light source 110 emits an output beam of light 125 which may be continuous wave (CW), pulsed, or modulated in any suitable manner for a given application. The output beam of light 125 is directed downrange toward a remote target 130. As an example, the remote target 130 may be located a distance D of approximately 1 m to 1 km from the lidar system 100.

Once the output beam 125 reaches the downrange target 130, the target may scatter or reflect at least a portion of light from the output beam 125, and some of the scattered or reflected light may return toward the lidar system 100. In the example of FIG. 1, the scattered or reflected light is represented by input beam 135, which passes through scanner 120 and is reflected by mirror 115 and directed to receiver 140. In particular embodiments, a relatively small fraction of the light from output beam 125 may return to the lidar system 100 as input beam 135. As an example, the ratio of input beam 135 average power, peak power, or pulse energy to output beam 125 average power, peak power, or pulse energy may be approximately $10^{-1}$, $10^{-2}$, $10^{-3}$, $10^{-4}$, $10^{-5}$, $10-6$, $10^{-7}$, $10^{-8}$, $10^{-9}$, $10^{-10}$, $10^{-11}$, or $10^{-12}$. As another example, if a pulse of output beam 125 has a pulse energy of 1 microjoule (µJ), then the pulse energy of a corresponding pulse of input beam 135 may have a pulse energy of approximately 10 nanojoules (nJ), 1 nJ, 100 picojoules (pJ), 10 pJ, 1 pJ, 100 femtojoules (fJ), 10 fJ, 1 fJ, 100 attojoules (aJ), 10 aJ, 1 aJ, or 0.1 aJ. In particular embodiments, output beam 125 may be referred to as an optical signal, laser beam, light beam, optical beam, emitted beam, emitted light, or beam. In particular embodiments, input beam 135 may be referred to as a received optical signal, return beam, received beam, return light, received light, input light, scattered light, or reflected light. As used herein, scattered light may refer to light that is scattered or reflected by a target 130. As an example, an input beam 135 may include: light from the output beam 125 that is scattered by target 130; light from the output beam 125 that is reflected by target 130; or a combination of scattered and reflected light from target 130.

In particular embodiments, receiver 140 may receive or detect photons from input beam 135 and produce one or more representative signals. For example, the receiver 140 may produce an output electrical signal 145 that is representative of the input beam 135, and the electrical signal 145 may be sent to controller 150. In particular embodiments, receiver 140 or controller 150 may include a processor, computing system (e.g., an ASIC or FPGA), or other suitable circuitry. A controller 150 may be configured to analyze one or more characteristics of the electrical signal 145 from the receiver 140 to determine one or more characteristics of the target 130, such as its distance downrange from the lidar system 100. This may be done, for example, by analyzing a time of flight or a frequency or phase modulation of a transmitted beam of light 125 or a received beam of light 135. If lidar system 100 measures a time of flight of T (e.g., T represents a round-trip time of flight for an emitted pulse of light to travel from the lidar system 100 to the target 130 and back to the lidar system 100), then the distance D from the target 130 to the lidar system 100 may be expressed as $D = c \cdot T/2$, where c is the speed of light (approximately $3.0 \times 10^8$ m/s). As an example, if a time of flight is measured to be T=300 ns, then the distance from the target 130 to the lidar system 100 may be determined to be approximately D=45.0 m. As another example, if a time of flight is measured to be T=1.33 μs, then the distance from the target 130 to the lidar system 100 may be determined to be approximately D=199.5 m. In particular embodiments, a distance D from lidar system 100 to a target 130 may be referred to as a distance, depth, or range of target 130. As used herein, the speed of light c refers to the speed of light in any suitable medium, such as for example in air, water, or vacuum. As an example, the speed of light in vacuum is approximately $2.9979 \times 10^8$ m/s, and the speed of light in air (which has a refractive index of approximately 1.0003) is approximately $2.9970 \times 10^8$ m/s.

In particular embodiments, light source 110 may include a pulsed or CW laser. As an example, light source 110 may be a pulsed laser configured to produce or emit pulses of light with a pulse duration or pulse width of approximately 10 picoseconds (ps) to 100 nanoseconds (ns). The pulses may have a pulse duration of approximately 100 ps, 200 ps, 400 ps, 1 ns, 2 ns, 5 ns, 10 ns, 20 ns, 50 ns, 100 ns, or any other suitable pulse duration. As another example, light source 110 may be a pulsed laser that produces pulses with a pulse duration of approximately 1-5 ns. As another example, light source 110 may be a pulsed laser that produces pulses at a pulse repetition frequency of approximately 100 kHz to 10 MHz or a pulse period (e.g., a time between consecutive pulses) of approximately 100 ns to 10 μs. In particular embodiments, light source 110 may have a substantially constant pulse repetition frequency, or light source 110 may have a variable or adjustable pulse repetition frequency. As an example, light source 110 may be a pulsed laser that produces pulses at a substantially constant pulse repetition frequency of approximately 640 kHz (e.g., 640,000 pulses per second), corresponding to a pulse period of approximately 1.56 μs. As another example, light source 110 may have a pulse repetition frequency (which may be referred to as a repetition rate) that can be varied from approximately 200 kHz to 3 MHz. As used herein, a pulse of light may be referred to as an optical pulse, a light pulse, or a pulse.

In particular embodiments, light source 110 may include a pulsed or CW laser that produces a free-space output beam 125 having any suitable average optical power. As an example, output beam 125 may have an average power of approximately 1 milliwatt (mW), 10 mW, 100 mW, 1 watt (W), 10 W, or any other suitable average power. In particular embodiments, output beam 125 may include optical pulses with any suitable pulse energy or peak optical power. As an example, output beam 125 may include pulses with a pulse energy of approximately 0.01 μJ, 0.1 μJ, 0.5 μJ, 1 μJ, 2 μJ, 10 μJ, 100 μJ, 1 mJ, or any other suitable pulse energy. As another example, output beam 125 may include pulses with a peak power of approximately 10 W, 100 W, 1 kW, 5 kW, 10 kW, or any other suitable peak power. The peak power ($P_{peak}$) of a pulse of light can be related to the pulse energy (E) by the expression $E = P_{peak} \cdot \Delta t$, where $\Delta t$ is the duration of the pulse, and the duration of a pulse may be defined as the full width at half maximum duration of the pulse. For example, an optical pulse with a duration of 1 ns and a pulse energy of 1 μJ has a peak power of approximately 1 kW. The average power ($P_{av}$) of an output beam 125 can be related to the pulse repetition frequency (PRF) and pulse energy by the expression $P_{av} = PRF \cdot E$. For example, if the pulse repetition frequency is 500 kHz, then the average power of an output beam 125 with 1-μJ pulses is approximately 0.5 W.

In particular embodiments, light source 110 may include a laser diode, such as for example, a Fabry-Perot laser diode, a quantum well laser, a distributed Bragg reflector (DBR) laser, a distributed feedback (DFB) laser, a vertical-cavity surface-emitting laser (VCSEL), a quantum dot laser diode, a grating-coupled surface-emitting laser (GCSEL), a slab-coupled optical waveguide laser (SCOWL), a single-transverse-mode laser diode, a multi-mode broad area laser diode, a laser-diode bar, a laser-diode stack, or a tapered-stripe laser diode. As an example, light source 110 may include an aluminum-gallium-arsenide (AlGaAs) laser diode, an indium-gallium-arsenide (InGaAs) laser diode, an indium-gallium-arsenide-phosphide (InGaAsP) laser diode, or a laser diode that includes any suitable combination of aluminum (Al), indium (In), gallium (Ga), arsenic (As), phosphorous (P), or any other suitable material. In particular embodiments, light source 110 may include a pulsed or CW laser diode with a peak emission wavelength between 1200 nm and 1600 nm. As an example, light source 110 may include a current-modulated InGaAsP DFB laser diode that produces optical pulses at a wavelength of approximately 1550 nm.

In particular embodiments, light source 110 may include a pulsed or CW laser diode followed by one or more optical-amplification stages. A pulsed laser diode may produce relatively low-power optical seed pulses which are amplified by an optical amplifier. As an example, light source 110 may be a fiber-laser module that includes a current-modulated laser diode with an operating wavelength of approximately 1550 nm followed by a single-stage or a multi-stage erbium-doped fiber amplifier (EDFA) or erbium-ytterbium-doped fiber amplifier (EYDFA) that amplifies the seed pulses from the laser diode. As another example, light source 110 may include a continuous-wave (CW) or quasi-CW laser diode followed by an external optical modulator (e.g., an electro-optic amplitude modulator). The optical modulator may modulate the CW light from the laser diode to produce optical pulses which are sent to an optical amplifier. As another example, light source 110 may include a pulsed or CW laser diode followed by a semiconductor optical amplifier (SOA). The SOA may include an active optical waveguide configured to receive light from the laser diode and amplify the light as it propagates through the waveguide. The SOA may be integrated on the same chip as the laser diode, or the SOA may be a separate device with an anti-reflection coating on its input facet or output facet.

In particular embodiments, light source 110 may include a direct-emitter laser diode. A direct-emitter laser diode (which may be referred to as a direct emitter) may include a laser diode which produces light that is not subsequently amplified by an optical amplifier. A light source 110 that includes a direct-emitter laser diode may not include an optical amplifier, and the output light produced by a direct emitter may not be amplified after it is emitted by the laser diode. The light produced by a direct-emitter laser diode (e.g., optical pulses, CW light, or frequency-modulated light) may be emitted directly as a free-space output beam 125 without being amplified. A direct-emitter laser diode may be driven by an electrical power source that supplies current pulses to the laser diode, and each current pulse may result in the emission of an output optical pulse.

In particular embodiments, light source 110 may include a diode-pumped solid-state (DPSS) laser. A DPSS laser (which may be referred to as a solid-state laser) may refer to a laser that includes a solid-state, glass, ceramic, or crystal-based gain medium that is pumped by one or more pump laser diodes. The gain medium may include a host material that is doped with rare-earth ions (e.g., neodymium, erbium, ytterbium, or praseodymium). For example, a gain medium may include a yttrium aluminum garnet (YAG) crystal that is doped with neodymium (Nd) ions, and the gain medium may be referred to as a Nd:YAG crystal. A DPSS laser with a Nd:YAG gain medium may produce light at a wavelength between approximately 1300 nm and approximately 1400 nm, and the Nd:YAG gain medium may be pumped by one or more pump laser diodes with an operating wavelength between approximately 730 nm and approximately 900 nm. A DPSS laser may be a passively Q-switched laser that includes a saturable absorber (e.g., a vanadium-doped crystal that acts as a saturable absorber). Alternatively, a DPSS laser may be an actively Q-switched laser that includes an active Q-switch (e.g., an acousto-optic modulator or an electro-optic modulator). A passively or actively Q-switched DPSS laser may produce output optical pulses that form an output beam 125 of a lidar system 100.

In particular embodiments, an output beam of light 125 emitted by light source 110 may be a collimated optical beam having any suitable beam divergence, such as for example, a full-angle beam divergence of approximately 0.5 to 10 milliradians (mrad). A divergence of output beam 125 may refer to an angular measure of an increase in beam size (e.g., a beam radius or beam diameter) as output beam 125 travels away from light source 110 or lidar system 100. In particular embodiments, output beam 125 may have a substantially circular cross section with a beam divergence characterized by a single divergence value. As an example, an output beam 125 with a circular cross section and a full-angle beam divergence of 2 mrad may have a beam diameter or spot size of approximately 20 cm at a distance of 100 m from lidar system 100. In particular embodiments, output beam 125 may have a substantially elliptical cross section characterized by two divergence values. As an example, output beam 125 may have a fast axis and a slow axis, where the fast-axis divergence is greater than the slow-axis divergence. As another example, output beam 125 may be an elliptical beam with a fast-axis divergence of 4 mrad and a slow-axis divergence of 2 mrad.

In particular embodiments, an output beam of light 125 emitted by light source 110 may be unpolarized or randomly polarized, may have no specific or fixed polarization (e.g., the polarization may vary with time), or may have a particular polarization (e.g., output beam 125 may be linearly polarized, elliptically polarized, or circularly polarized). As an example, light source 110 may produce light with no specific polarization or may produce light that is linearly polarized.

In particular embodiments, lidar system 100 may include one or more optical components configured to reflect, focus, filter, shape, modify, steer, or direct light within the lidar system 100 or light produced or received by the lidar system 100 (e.g., output beam 125 or input beam 135). As an example, lidar system 100 may include one or more lenses, mirrors, filters (e.g., bandpass or interference filters), beam splitters, polarizers, polarizing beam splitters, wave plates (e.g., half-wave or quarter-wave plates), diffractive elements, holographic elements, isolators, couplers, detectors, beam combiners, or collimators. The optical components in a lidar system 100 may be free-space optical components, fiber-coupled optical components, or a combination of free-space and fiber-coupled optical components.

In particular embodiments, lidar system 100 may include a telescope, one or more lenses, or one or more mirrors configured to expand, focus, or collimate the output beam 125 or the input beam 135 to a desired beam diameter or divergence. As an example, the lidar system 100 may include one or more lenses to focus the input beam 135 onto a photodetector of receiver 140. As another example, the lidar system 100 may include one or more flat mirrors or curved mirrors (e.g., concave, convex, or parabolic mirrors) to steer or focus the output beam 125 or the input beam 135. For example, the lidar system 100 may include an off-axis parabolic mirror to focus the input beam 135 onto a photodetector of receiver 140. As illustrated in FIG. 1, the lidar system 100 may include mirror 115 (which may be a metallic or dielectric mirror), and mirror 115 may be configured so that light beam 125 passes through the mirror 115 or passes along an edge or side of the mirror 115 and input beam 135 is reflected toward the receiver 140. As an example, mirror 115 (which may be referred to as an overlap mirror, superposition mirror, or beam-combiner mirror) may include a hole, slot, or aperture which output light beam 125 passes through. As another example, rather than passing through the mirror 115, the output beam 125 may be directed to pass alongside the mirror 115 with a gap (e.g., a gap of width approximately 0.1 mm, 0.5 mm, 1 mm, 2 mm, 5 mm, or 10 mm) between the output beam 125 and an edge of the mirror 115.

In particular embodiments, mirror 115 may provide for output beam 125 and input beam 135 to be substantially coaxial so that the two beams travel along approximately the same optical path (albeit in opposite directions). The input and output beams being substantially coaxial may refer to the beams being at least partially overlapped or sharing a common propagation axis so that input beam 135 and output beam 125 travel along substantially the same optical path (albeit in opposite directions). As an example, output beam 125 and input beam 135 may be parallel to each other to within less than 10 mrad, 5 mrad, 2 mrad, 1 mrad, 0.5 mrad, or 0.1 mrad. As output beam 125 is scanned across a field of regard, the input beam 135 may follow along with the output beam 125 so that the coaxial relationship between the two beams is maintained.

In particular embodiments, lidar system 100 may include a scanner 120 configured to scan an output beam 125 across a field of regard of the lidar system 100. As an example, scanner 120 may include one or more scanning mirrors configured to pivot, rotate, oscillate, or move in an angular manner about one or more rotation axes. The output beam 125 may be reflected by a scanning mirror, and as the scanning mirror pivots or rotates, the reflected output beam 125 may be scanned in a corresponding angular manner. As an example, a scanning mirror may be configured to periodically pivot back and forth over a 30-degree range, which results in the output beam 125 scanning back and forth across a 60-degree range (e.g., a 0-degree rotation by a scanning mirror results in a 20-degree angular scan of output beam 125).

In particular embodiments, a scanning mirror may be attached to or mechanically driven by a scanner actuator or mechanism which pivots or rotates the mirror over a particular angular range (e.g., over a 5° angular range, 30° angular range, 60° angular range, 120° angular range, 360° angular range, or any other suitable angular range). A scanner actuator or mechanism configured to pivot or rotate a mirror may include a galvanometer scanner, a resonant scanner, a piezoelectric actuator, a voice coil motor, an electric motor (e.g., a DC motor, a brushless DC motor, a synchronous electric motor, or a stepper motor), a micro-electromechanical systems (MEMS) device, or any other suitable actuator or mechanism. As an example, a scanner 120 may include a scanning mirror attached to a galvanometer scanner configured to pivot back and forth over a 30° angular range. As another example, a scanner 120 may include a polygon mirror configured to rotate continuously in the same direction (e.g., rather than pivoting back and forth, the polygon mirror continuously rotates 360 degrees in a clockwise or counterclockwise direction). The polygon mirror may be coupled or attached to a synchronous motor configured to rotate the polygon mirror at a substantially fixed rotational frequency (e.g., a rotational frequency of approximately 1 Hz, 10 Hz, 50 Hz, 100 Hz, 500 Hz, or 1,000 Hz).

In particular embodiments, scanner 120 may be configured to scan the output beam 125 (which may include at least a portion of the light emitted by light source 110) across a field of regard of the lidar system 100. A field of regard (FOR) of a lidar system 100 may refer to an area, region, or angular range over which the lidar system 100 may be configured to scan or capture distance information. As an example, a lidar system 100 with an output beam 125 with a 30-degree scanning range may be referred to as having a 30-degree angular field of regard. As another example, a lidar system 100 with a scanning mirror that rotates over a 30-degree range may produce an output beam 125 that scans across a 60-degree range (e.g., a 60-degree FOR). In particular embodiments, lidar system 100 may have a FOR of approximately 10°, 20°, 40°, 60°, 120°, 360°, or any other suitable FOR.

In particular embodiments, scanner 120 may be configured to scan the output beam 125 horizontally and vertically, and lidar system 100 may have a particular FOR along the horizontal direction and another particular FOR along the vertical direction. As an example, lidar system 100 may have a horizontal FOR of 10° to 120° and a vertical FOR of 2° to 45°. In particular embodiments, scanner 120 may include a first scan mirror and a second scan mirror, where the first scan mirror directs the output beam 125 toward the second scan mirror, and the second scan mirror directs the output beam 125 downrange from the lidar system 100. As an example, the first scan mirror may scan the output beam 125 along a first direction, and the second scan mirror may scan the output beam 125 along a second direction that is substantially orthogonal to the first direction. As another example, the first scan mirror may scan the output beam 125 along a substantially horizontal direction, and the second scan mirror may scan the output beam 125 along a substantially vertical direction (or vice versa). As another example, the first and second scan mirrors may each be driven by galvanometer scanners. As another example, the first or second scan mirror may include a polygon mirror driven by an electric motor. In particular embodiments, scanner 120 may be referred to as a beam scanner, optical scanner, or laser scanner.

In particular embodiments, one or more scanning mirrors may be communicatively coupled to controller 150 which may control the scanning mirror(s) so as to guide the output beam 125 in a desired direction downrange or along a desired scan pattern. In particular embodiments, a scan pattern may refer to a pattern or path along which the output beam 125 is directed. As an example, scanner 120 may include two scanning mirrors configured to scan the output beam 125 across a 60° horizontal FOR and a 20° vertical FOR. The two scanner mirrors may be controlled to follow a scan path that substantially covers the 60°×20° FOR. As an example, the scan path may result in a point cloud with pixels that substantially cover the 60°×20° FOR. The pixels may be approximately evenly distributed across the 60°×20° FOR. Alternatively, the pixels may have a particular non-uniform distribution (e.g., the pixels may be distributed across all or a portion of the 60°×20° FOR, and the pixels may have a higher density in one or more particular regions of the 60°×20° FOR).

In particular embodiments, a lidar system 100 may include a light source 110 configured to emit pulses of light and a scanner 120 configured to scan at least a portion of the emitted pulses of light across a field of regard of the lidar system 100. One or more of the emitted pulses of light may be scattered by a target 130 located downrange from the lidar system 100, and a receiver 140 may detect at least a portion of the pulses of light scattered by the target 130. A receiver 140 may be referred to as a photoreceiver, optical receiver, optical sensor, detector, photodetector, or optical detector. In particular embodiments, lidar system 100 may include a receiver 140 that receives or detects at least a portion of input beam 135 and produces an electrical signal that corresponds to input beam 135. As an example, if input beam 135 includes an optical pulse, then receiver 140 may produce an electrical current or voltage pulse that corresponds to the optical pulse detected by receiver 140. As another example, receiver 140 may include one or more avalanche photodiodes (APDs) or one or more single-photon avalanche diodes (SPADs). As another example, receiver 140 may include one or more PN photodiodes (e.g., a photodiode structure formed by a p-type semiconductor and a n-type semiconductor, where the PN acronym refers to the structure having p-doped and n-doped regions) or one or more PIN photodiodes (e.g., a photodiode structure formed by an undoped intrinsic semiconductor region located between p-type and n-type regions, where the PIN acronym refers to the structure having p-doped, intrinsic, and n-doped regions). An APD, SPAD, PN photodiode, or PIN photodiode may each be referred to as a detector, photodetector, or photodiode. A detector may have an active region or an avalanche-multiplication region that includes silicon, germanium, InGaAs, or AlInAsSb (aluminum indium arsenide antimonide). The active region may refer to an area over which a detector may receive or detect input light. An active region may have any suitable size or diameter, such as for example, a diameter of approximately 10 μm, 25 μm, 50 μm, 80 μm, 100 μm, 200 μm, 500 μm, 1 mm, 2 mm, or 5 mm.

In particular embodiments, receiver 140 may include electronic circuitry that performs signal amplification, sampling, filtering, signal conditioning, analog-to-digital conversion, time-to-digital conversion, pulse detection, threshold detection, rising-edge detection, or falling-edge detection. As an example, receiver 140 may include a transimpedance amplifier that converts a received photocurrent (e.g., a current produced by an APD in response to a received optical signal) into a voltage signal. The voltage signal may be sent to pulse-detection circuitry that produces an analog or digital output signal 145 that corresponds to one or more optical characteristics (e.g., rising edge, falling edge, amplitude, duration, or energy) of a received optical pulse. As an example, the pulse-detection circuitry may perform a time-to-digital conversion to produce a digital output signal 145. The electrical output signal 145 may be sent to controller 150 for processing or analysis (e.g., to determine a time-of-flight value corresponding to a received optical pulse).

In particular embodiments, controller 150 may be electrically coupled or communicatively coupled to light source 110, scanner 120, or receiver 140. As an example, controller 150 may receive electrical trigger pulses or edges from light source 110, where each pulse or edge corresponds to the emission of an optical pulse by light source 110. As another example, controller 150 may provide instructions, a control signal, or a trigger signal to light source 110 indicating when light source 110 should produce optical pulses. Controller 150 may send an electrical trigger signal that includes electrical pulses, where each electrical pulse results in the emission of an optical pulse by light source 110. In particular embodiments, the frequency, period, duration, pulse energy, peak power, average power, or wavelength of the optical pulses produced by light source 110 may be adjusted based on instructions, a control signal, or trigger pulses provided by controller 150. In particular embodiments, controller 150 may be coupled to light source 110 and receiver 140, and controller 150 may determine a time-of-flight value for an optical pulse based on timing information associated with when the pulse was emitted by light source 110 and when a portion of the pulse (e.g., input beam 135) was detected or received by receiver 140. In particular embodiments, controller 150 may include circuitry that performs signal amplification, sampling, filtering, signal conditioning, analog-to-digital conversion, time-to-digital conversion, pulse detection, threshold detection, rising-edge detection, or falling-edge detection.

In particular embodiments, lidar system 100 may include one or more processors (e.g., a controller 150) configured to determine a distance D from the lidar system 100 to a target 130 based at least in part on a round-trip time of flight for an emitted pulse of light to travel from the lidar system 100 to the target 130 and back to the lidar system 100. The target 130 may be at least partially contained within a field of regard of the lidar system 100 and located a distance D from the lidar system 100 that is less than or equal to an operating range ($R_{OP}$) of the lidar system 100. In particular embodiments, an operating range (which may be referred to as an operating distance) of a lidar system 100 may refer to a distance over which the lidar system 100 is configured to sense or identify targets 130 located within a field of regard of the lidar system 100. The operating range of lidar system 100 may be any suitable distance, such as for example, 25 m, 50 m, 100 m, 200 m, 500 m, or 1 km. As an example, a lidar system 100 with a 200-m operating range may be configured to sense or identify various targets 130 located up to 200 m away from the lidar system 100. The operating range $R_{OP}$ of a lidar system 100 may be related to the time τ between the emission of successive optical signals by the expression $R_{OP}=c·τ/2$. For a lidar system 100 with a 200-m operating range ($R_{OP}$=200 m), the time τ between successive pulses (which may be referred to as the pulse period) is approximately $2·R_{OP}/c \cong 1.33$ μs. The pulse period T may also correspond to the time of flight for a pulse to travel to and from a target 130 located a distance $R_{OP}$ from the lidar system 100. Additionally, the pulse period τ may be related to the pulse repetition frequency (PRF) by the expression τ=1/PRF. For example, a pulse period of 1.33 μs corresponds to a PRF of approximately 752 kHz.

In particular embodiments, a lidar system 100 may be used to determine the distance to one or more downrange targets 130. By scanning the lidar system 100 across a field of regard, the system may be used to map the distance to a number of points within the field of regard. Each of these depth-mapped points may be referred to as a pixel or a voxel. A collection of pixels captured in succession (which may be referred to as a depth map, a point cloud, or a frame) may be rendered as an image or may be analyzed to identify or detect objects or to determine a shape or distance of objects within the FOR. As an example, a point cloud may cover a field of regard that extends 60° horizontally and 15° vertically, and the point cloud may include a frame of 100-2000 pixels in the horizontal direction by 4-400 pixels in the vertical direction.

In particular embodiments, lidar system 100 may be configured to repeatedly capture or generate point clouds of a field of regard at any suitable frame rate between approximately 0.1 frames per second (FPS) and approximately 1,000 FPS. As an example, lidar system 100 may generate point clouds at a frame rate of approximately 0.1 FPS, 0.5 FPS, 1 FPS, 2 FPS, 5 FPS, 10 FPS, 20 FPS, 100 FPS, 500 FPS, or 1,000 FPS. As another example, lidar system 100 may be configured to produce optical pulses at a rate of $5×10^5$ pulses/second (e.g., the system may determine 500,000 pixel distances per second) and scan a frame of 1000×50 pixels (e.g., 50,000 pixels/frame), which corresponds to a point-cloud frame rate of 10 frames per second (e.g., 10 point clouds per second). In particular embodiments, a point-cloud frame rate may be substantially fixed, or a point-cloud frame rate may be dynamically adjustable. As an example, a lidar system 100 may capture one or more point clouds at a particular frame rate (e.g., 1 Hz) and then switch to capture one or more point clouds at a different frame rate (e.g., 10 Hz). A slower frame rate (e.g., 1 Hz) may be used to capture one or more high-resolution point clouds, and a faster frame rate (e.g., 10 Hz) may be used to rapidly capture multiple lower-resolution point clouds.

In particular embodiments, a lidar system 100 may be configured to sense, identify, or determine distances to one or more targets 130 within a field of regard. As an example, a lidar system 100 may determine a distance to a target 130, where all or part of the target 130 is contained within a field of regard of the lidar system 100. All or part of a target 130 being contained within a FOR of the lidar system 100 may refer to the FOR overlapping, encompassing, or enclosing at least a portion of the target 130. In particular embodiments, target 130 may include all or part of an object that is moving or stationary relative to lidar system 100. As an example, target 130 may include all or a portion of a person, vehicle, motorcycle, truck, train, bicycle, wheelchair, pedestrian, animal, road sign, traffic light, lane marking, road-surface marking, parking space, pylon, guard rail, traffic barrier, pothole, railroad crossing, obstacle in or near a road, curb, stopped vehicle on or beside a road, utility pole, house, building, trash can, mailbox, tree, any other suitable object, or any suitable combination of all or part of two or more objects. In particular embodiments, a target may be referred to as an object.

In particular embodiments, light source 110, scanner 120, and receiver 140 may be packaged together within a single housing, where a housing may refer to a box, case, or enclosure that holds or contains all or part of a lidar system 100. As an example, a lidar-system enclosure may contain a light source 110, mirror 115, scanner 120, and receiver 140 of a lidar system 100. Additionally, the lidar-system enclosure may include a controller 150. The lidar-system enclosure may also include one or more electrical connections for conveying electrical power or electrical signals to or from the enclosure. In particular embodiments, one or more components of a lidar system 100 may be located remotely from a lidar-system enclosure. As an example, all or part of light source 110 may be located remotely from a lidar-system enclosure, and pulses of light produced by the light source 110 may be conveyed to the enclosure via optical fiber. As another example, all or part of a controller 150 may be located remotely from a lidar-system enclosure.

In particular embodiments, light source 110 may include an eye-safe laser, or lidar system 100 may be classified as an eye-safe laser system or laser product. An eye-safe laser, laser system, or laser product may refer to a system that includes a laser with an emission wavelength, average power, peak power, peak intensity, pulse energy, beam size, beam divergence, exposure time, or scanned output beam such that emitted light from the system presents little or no possibility of causing damage to a person's eyes. As an example, light source 110 or lidar system 100 may be classified as a Class 1 laser product (as specified by the 60825-1 standard of the International Electrotechnical Commission (IEC)) or a Class I laser product (as specified by Title 21, Section 1040.10 of the United States Code of Federal Regulations (CFR)) that is safe under all conditions of normal use. In particular embodiments, lidar system 100 may be an eye-safe laser product (e.g., with a Class 1 or Class I classification) configured to operate at any suitable wavelength between approximately 900 nm and approximately 2100 nm. As an example, lidar system 100 may include a laser with an operating wavelength between approximately 1200 nm and approximately 1400 nm or between approximately 1400 nm and approximately 1600 nm, and the laser or the lidar system 100 may be operated in an eye-safe manner. As another example, lidar system 100 may be an eye-safe laser product that includes a scanned laser with an operating wavelength between approximately 1530 nm and approximately 1560 nm. As another example, lidar system 100 may be a Class 1 or Class I laser product that includes a laser diode, fiber laser, or solid-state laser with an operating wavelength between approximately 1200 nm and approximately 1600 nm.

In particular embodiments, one or more lidar systems 100 may be integrated into a vehicle. As an example, multiple lidar systems 100 may be integrated into a car to provide a complete 360-degree horizontal FOR around the car. As another example, 4-10 lidar systems 100, each system having a 45-degree to 90-degree horizontal FOR, may be combined together to form a sensing system that provides a point cloud covering a 360-degree horizontal FOR. The lidar systems 100 may be oriented so that adjacent FORs have an amount of spatial or angular overlap to allow data from the multiple lidar systems 100 to be combined or stitched together to form a single or continuous 360-degree point cloud. As an example, the FOR of each lidar system 100 may have approximately 1-15 degrees of overlap with an adjacent FOR. In particular embodiments, a vehicle may refer to a mobile machine configured to transport people or cargo. For example, a vehicle may include, may take the form of, or may be referred to as a car, automobile, motor vehicle, truck, bus, van, trailer, off-road vehicle, farm vehicle, lawn mower, construction equipment, forklift, robot, golf cart, motorhome, taxi, motorcycle, scooter, bicycle, skateboard, train, snowmobile, watercraft (e.g., a ship or boat), aircraft (e.g., a fixed-wing aircraft, helicopter, or dirigible), unmanned aerial vehicle (e.g., drone), or spacecraft. In particular embodiments, a vehicle may include an internal combustion engine or an electric motor that provides propulsion for the vehicle.

In particular embodiments, one or more lidar systems 100 may be included in a vehicle as part of an advanced driver assistance system (ADAS) to assist a driver of the vehicle in operating the vehicle. For example, a lidar system 100 may be part of an ADAS that provides information or feedback to a driver (e.g., to alert the driver to potential problems or hazards) or that automatically takes control of part of a vehicle (e.g., a braking system or a steering system) to avoid collisions or accidents. A lidar system 100 may be part of a vehicle ADAS that provides adaptive cruise control, automated braking, automated parking, collision avoidance, alerts the driver to hazards or other vehicles, maintains the vehicle in the correct lane, or provides a warning if an object or another vehicle is in a blind spot.

In particular embodiments, one or more lidar systems 100 may be integrated into a vehicle as part of an autonomous-vehicle driving system. As an example, a lidar system 100 may provide information about the surrounding environment to a driving system of an autonomous vehicle. An autonomous-vehicle driving system may be configured to guide the autonomous vehicle through an environment surrounding the vehicle and toward a destination. An autonomous-vehicle driving system may include one or more computing systems that receive information from a lidar system 100 about the surrounding environment, analyze the received information, and provide control signals to the vehicle's driving systems (e.g., steering wheel, accelerator, brake, or turn signal). As an example, a lidar system 100 integrated into an autonomous vehicle may provide an autonomous-vehicle driving system with a point cloud every 0.1 seconds (e.g., the point cloud has a 10 Hz update rate, representing 10 frames per second). The autonomous-vehicle driving system may analyze the received point clouds to sense or identify targets 130 and their respective locations, distances, or speeds, and the autonomous-vehicle driving system may update control signals based on this information. As an example, if lidar system 100 detects a vehicle ahead that is slowing down or stopping, the autonomous-vehicle driving system may send instructions to release the accelerator and apply the brakes.

In particular embodiments, an autonomous vehicle may be referred to as an autonomous car, driverless car, self-driving car, robotic car, or unmanned vehicle. In particular embodiments, an autonomous vehicle may refer to a vehicle configured to sense its environment and navigate or drive with little or no human input. As an example, an autonomous vehicle may be configured to drive to any suitable location and control or perform all safety-critical functions (e.g., driving, steering, braking, parking) for the entire trip, with the driver not expected to control the vehicle at any time. As another example, an autonomous vehicle may allow a driver to safely turn their attention away from driving tasks in particular environments (e.g., on freeways), or an autonomous vehicle may provide control of a vehicle in all but a few environments, requiring little or no input or attention from the driver.

In particular embodiments, an autonomous vehicle may be configured to drive with a driver present in the vehicle, or an autonomous vehicle may be configured to operate the vehicle with no driver present. As an example, an autonomous vehicle may include a driver's seat with associated controls (e.g., steering wheel, accelerator pedal, and brake pedal), and the vehicle may be configured to drive with no one seated in the driver's seat or with little or no input from a person seated in the driver's seat. As another example, an autonomous vehicle may not include any driver's seat or associated driver's controls, and the vehicle may perform substantially all driving functions (e.g., driving, steering, braking, parking, and navigating) without human input. As another example, an autonomous vehicle may be configured to operate without a driver (e.g., the vehicle may be configured to transport human passengers or cargo without a driver present in the vehicle). As another example, an autonomous vehicle may be configured to operate without any human passengers (e.g., the vehicle may be configured for transportation of cargo without having any human passengers onboard the vehicle).

In particular embodiments, an optical signal (which may be referred to as a light signal, a light waveform, an optical waveform, an output beam, or emitted light) may include pulses of light, CW light, amplitude-modulated light, frequency-modulated light, or any suitable combination thereof. Although this disclosure describes or illustrates example embodiments of lidar systems 100 or light sources 110 that produce optical signals that include pulses of light, the embodiments described or illustrated herein may also be applied, where appropriate, to other types of optical signals, including continuous-wave (CW) light, amplitude-modulated optical signals, or frequency-modulated optical signals. For example, a lidar system 100 as described or illustrated herein may include a light source 110 configured to produce pulses of light. Alternatively, a lidar system 100 may be configured to operate as a frequency-modulated continuous-wave (FMCW) lidar system and may include a light source 110 configured to produce CW light or a frequency-modulated optical signal.

In particular embodiments, a lidar system 100 may be a FMCW lidar system where the emitted light from the light source 110 (e.g., output beam 125 in FIG. 1 or FIG. 3) includes frequency-modulated light. A pulsed lidar system is a type of lidar system 100 in which the light source 110 emits pulses of light, and the distance to a remote target 130 is determined from the time-of-flight for a pulse of light to travel to the target 130 and back. Another type of lidar system 100 is a frequency-modulated lidar system, which may be referred to as a frequency-modulated continuous-wave (FMCW) lidar system. A FMCW lidar system uses frequency-modulated light to determine the distance to a remote target 130 based on a modulation frequency of the received light (which is scattered by the remote target) relative to the modulation frequency of the emitted light. A round-trip time for the emitted light to travel to a target 130 and back to the lidar system may correspond to a frequency difference between the received scattered light and a portion of the emitted light.

For example, for a linearly chirped light source (e.g., a frequency modulation that produces a linear change in frequency with time), the larger the frequency difference between the emitted light and the received light, the farther away the target 130 is located. The frequency difference may be determined by mixing the received light with a portion of the emitted light (e.g., by coupling the two beams onto a detector, or by mixing analog electric signals corresponding to the received light and the emitted light) and determining the resulting beat frequency. For example, an electrical signal from an APD may be analyzed using a fast Fourier transform (FFT) technique to determine the frequency difference between the emitted light and the received light. If a linear frequency modulation m (e.g., in units of Hz/s) is applied to a CW laser, then the round-trip time T may be related to the frequency difference between the received scattered light and the emitted light $\Delta f$ by the expression $T=\Delta f/m$. Additionally, the distance D from the target 130 to the lidar system 100 may be expressed as $D=c\cdot\Delta f/(2m)$, where c is the speed of light. For example, for a light source 110 with a linear frequency modulation of $10^{12}$ Hz/s (or, 1 MHz/µs), if a frequency difference (between the received scattered light and the emitted light) of 330 kHz is measured, then the distance to the target is approximately 50 meters (which corresponds to a round-trip time of approximately 330 ns). As another example, a frequency difference of 1.33 MHz corresponds to a target located approximately 200 meters away.

The light source 110 for a FMCW lidar system may be a fiber laser (e.g., a seed laser diode followed by one or more optical amplifiers) or a direct-emitter laser diode. The seed laser diode or the direct-emitter laser diode may be operated in a CW manner (e.g., by driving the laser diode with a substantially constant DC current), and the frequency modulation may be provided by an external modulator (e.g., an electro-optic phase modulator). Alternatively, the frequency modulation may be produced by applying a DC bias current along with a current modulation to the seed laser diode or the direct-emitter laser diode. The current modulation produces a corresponding refractive-index modulation in the laser diode, which results in a frequency modulation of the light emitted by the laser diode. The current-modulation component (and corresponding frequency modulation) may have any suitable frequency or shape (e.g., piecewise linear, sinusoidal, triangle-wave, or sawtooth).

Figure 2:
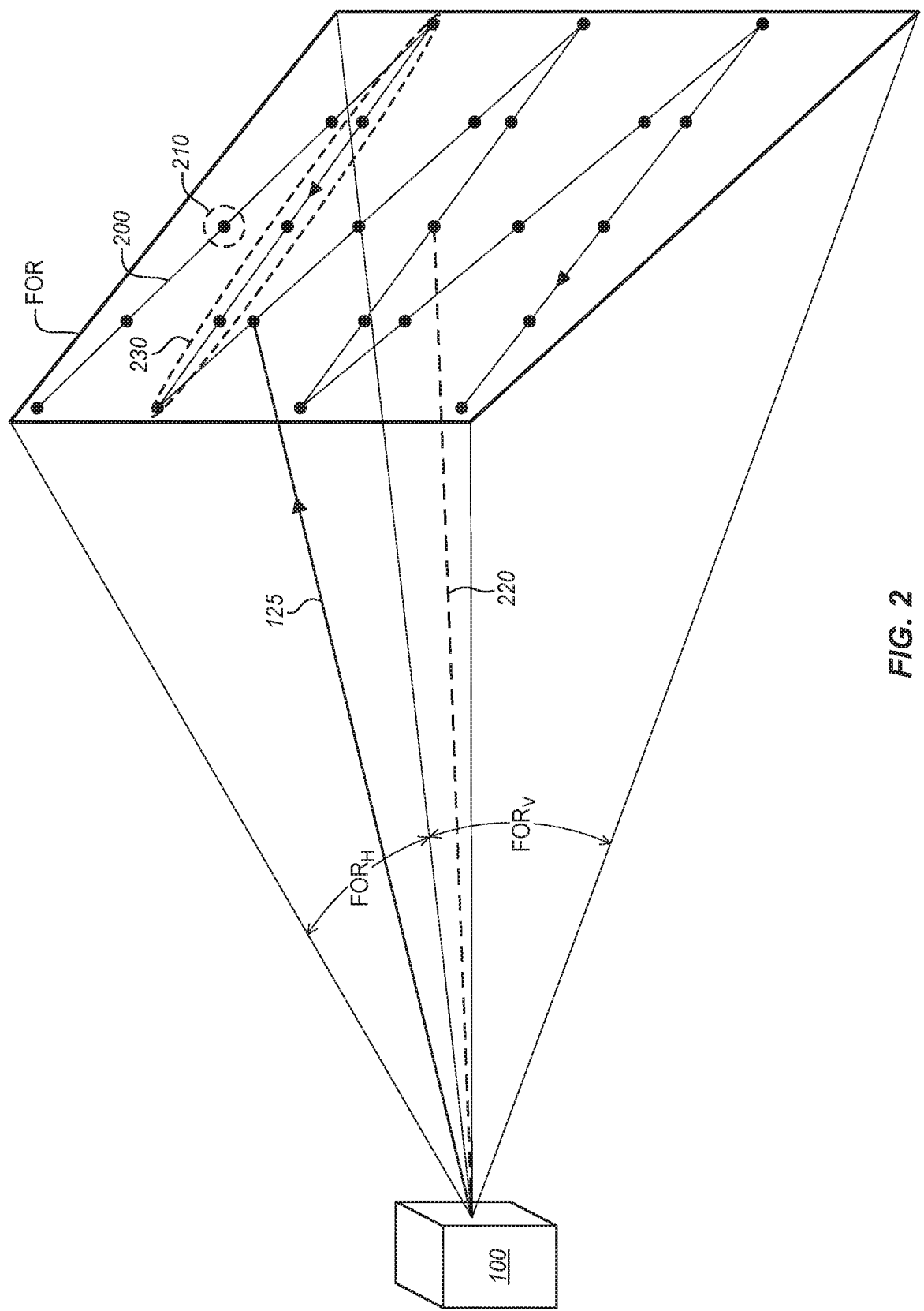
FIG. 2 illustrates an example scan pattern produced by a lidar system.

FIG. 2 illustrates an example scan pattern 200 produced by a lidar system 100. A scan pattern 200 (which may be referred to as an optical scan pattern, optical scan path, scan path, or scan) may represent a path or course followed by output beam 125 as it is scanned across all or part of a FOR. Each traversal of a scan pattern 200 may correspond to the capture of a single frame or a single point cloud. In particular embodiments, a lidar system 100 may be configured to scan output optical beam 125 along one or more particular scan patterns 200. In particular embodiments, a scan pattern 200 may scan across any suitable field of regard (FOR) having any suitable horizontal FOR ($FOR_H$) and any suitable vertical FOR ($FOR_V$). For example, a scan pattern 200 may have a field of regard represented by angular dimensions (e.g., $FOR_H \times FOR_V$) 40°×30°, 90°×40°, or 60°×15°. As another example, a scan pattern 200 may have a $FOR_H$ greater than or equal to 10°, 25°, 30°, 40°, 60°, 90°, or 120°. As another example, a scan pattern 200 may have a $FOR_V$ greater than or equal to 2°, 5°, 10°, 15°, 20°, 30°, or 45°.

In the example of FIG. 2, reference line 220 represents a center of the field of regard of scan pattern 200. In particular embodiments, reference line 220 may have any suitable orientation, such as for example, a horizontal angle of 0° (e.g., reference line 220 may be oriented straight ahead) and a vertical angle of 0° (e.g., reference line 220 may have an inclination of 0°), or reference line 220 may have a nonzero horizontal angle or a nonzero inclination (e.g., a vertical angle of +10° or −10°. In FIG. 2, if the scan pattern 200 has a 60°×15° field of regard, then scan pattern 200 covers a ±30° horizontal range with respect to reference line 220 and a ±7.5° vertical range with respect to reference line 220. Additionally, optical beam 125 in FIG. 2 has an orientation of approximately −15° horizontal and +3° vertical with respect to reference line 220. Optical beam 125 may be referred to as having an azimuth of −15° and an altitude of +3° relative to reference line 220. In particular embodiments, an azimuth (which may be referred to as an azimuth angle) may represent a horizontal angle with respect to reference line 220, and an altitude (which may be referred to as an altitude angle, elevation, or elevation angle) may represent a vertical angle with respect to reference line 220.

In particular embodiments, a scan pattern 200 may include multiple pixels 210, and each pixel 210 may be associated with one or more laser pulses or one or more distance measurements. Additionally, a scan pattern 200 may include multiple scan lines 230, where each scan line represents one scan across at least part of a field of regard, and each scan line 230 may include multiple pixels 210. In FIG. 2, scan line 230 includes five pixels 210 and corresponds to an approximately horizontal scan across the FOR from right to left, as viewed from the lidar system 100. In particular embodiments, a cycle of scan pattern 200 may include a total of $P_x \times P_y$ pixels 210 (e.g., a two-dimensional distribution of $P_x$ by $P_y$ pixels). As an example, scan pattern 200 may include a distribution with dimensions of approximately 100-2,000 pixels 210 along a horizontal direction and approximately 4-400 pixels 210 along a vertical direction. As another example, scan pattern 200 may include a distribution of 1,000 pixels 210 along the horizontal direction by 64 pixels 210 along the vertical direction (e.g., the frame size is 1000×64 pixels) for a total of 64,000 pixels per cycle of scan pattern 200. In particular embodiments, the number of pixels 210 along a horizontal direction may be referred to as a horizontal resolution of scan pattern 200, and the number of pixels 210 along a vertical direction may be referred to as a vertical resolution. As an example, scan pattern 200 may have a horizontal resolution of greater than or equal to 100 pixels 210 and a vertical resolution of greater than or equal to 4 pixels 210. As another example, scan pattern 200 may have a horizontal resolution of 100-2,000 pixels 210 and a vertical resolution of 4-400 pixels 210.

In particular embodiments, each pixel 210 may be associated with a distance (e.g., a distance to a portion of a target 130 from which an associated laser pulse was scattered) or one or more angular values. As an example, a pixel 210 may be associated with a distance value and two angular values (e.g., an azimuth and altitude) that represent the angular location of the pixel 210 with respect to the lidar system 100. A distance to a portion of target 130 may be determined based at least in part on a time-of-flight measurement for a corresponding pulse. An angular value (e.g., an azimuth or altitude) may correspond to an angle (e.g., relative to reference line 220) of output beam 125 (e.g., when a corresponding pulse is emitted from lidar system 100) or an angle of input beam 135 (e.g., when an input signal is received by lidar system 100). In particular embodiments, an angular value may be determined based at least in part on a position of a component of scanner 120. As an example, an azimuth or altitude value associated with a pixel 210 may be determined from an angular position of one or more corresponding scanning mirrors of scanner 120.

Figure 3:
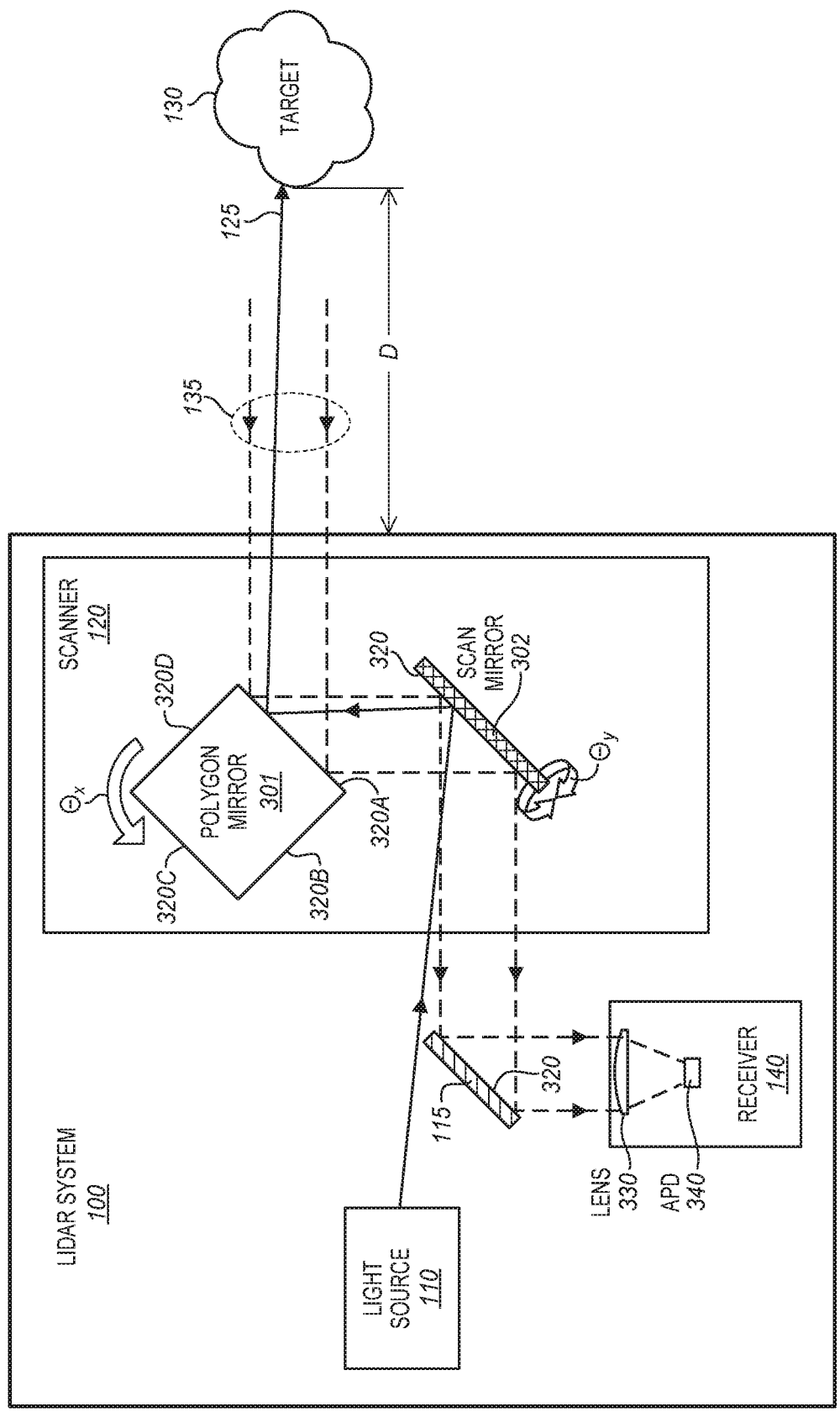
FIG. 3 illustrates an example lidar system with an example rotating polygon mirror.

FIG. 3 illustrates an example lidar system 100 with an example rotating polygon mirror 301. In particular embodiments, a scanner 120 may include a polygon mirror 301 configured to scan output beam 125 along a particular direction. In the example of FIG. 3, scanner 120 includes two scanning mirrors: (1) a polygon mirror 301 that rotates along the $\Theta_x$ direction and (2) a scanning mirror 302 that oscillates back and forth along the $\Theta_y$ direction. The output beam 125 from light source 110, which passes alongside mirror 115, is reflected by reflecting surface 320 of scan mirror 302 and is then reflected by a reflecting surface (e.g., surface 320A, 320B, 320C, or 320D) of polygon mirror 301. Scattered light from a target 130 returns to the lidar system 100 as input beam 135. The input beam 135 reflects from polygon mirror 301, scan mirror 302, and mirror 115, which directs input beam 135 through focusing lens 330 and to the detector 340 of receiver 140. The detector 340 may be a PN photodiode, a PIN photodiode, an APD, a SPAD, or any other suitable detector. A reflecting surface 320 (which may be referred to as a reflective surface) may include a reflective metallic coating (e.g., gold, silver, or aluminum) or a reflective dielectric coating, and the reflecting surface 320 may have any suitable reflectivity R at an operating wavelength of the light source 110 (e.g., R greater than or equal to 70%, 80%, 90%, 95%, 98%, or 99%).

In particular embodiments, a polygon mirror 301 may be configured to rotate along a $\Theta_x$ or $\Theta_y$ direction and scan output beam 125 along a substantially horizontal or vertical direction, respectively. A rotation along a $\Theta_x$ direction may refer to a rotational motion of mirror 301 that results in output beam 125 scanning along a substantially horizontal direction. Similarly, a rotation along a $\Theta_y$ direction may refer to a rotational motion that results in output beam 125 scanning along a substantially vertical direction. In FIG. 3, mirror 301 is a polygon mirror that rotates along the Ox direction and scans output beam 125 along a substantially horizontal direction, and mirror 302 pivots along the $\Theta_y$ direction and scans output beam 125 along a substantially vertical direction. In particular embodiments, a polygon mirror 301 may be configured to scan output beam 125 along any suitable direction. As an example, a polygon mirror 301 may scan output beam 125 at any suitable angle with respect to a horizontal or vertical direction, such as for example, at an angle of approximately 0°, 10°, 20°, 30°, 45°, 60°, 70°, 80°, or 90° with respect to a horizontal or vertical direction.

In particular embodiments, a polygon mirror 301 may refer to a multi-sided object having reflective surfaces 320 on two or more of its sides or faces. As an example, a polygon mirror may include any suitable number of reflective faces (e.g., 2, 3, 4, 5, 6, 7, 8, or 10 faces), where each face includes a reflective surface 320. A polygon mirror 301 may have a cross-sectional shape of any suitable polygon, such as for example, a triangle (with three reflecting surfaces 320), square (with four reflecting surfaces 320), pentagon (with five reflecting surfaces 320), hexagon (with six reflecting surfaces 320), heptagon (with seven reflecting surfaces 320), or octagon (with eight reflecting surfaces 320). In FIG. 3, the polygon mirror 301 has a substantially square cross-sectional shape and four reflecting surfaces (320A, 320B, 320C, and 320D). The polygon mirror 301 in FIG. 3 may be referred to as a square mirror, a cube mirror, or a four-sided polygon mirror. In FIG. 3, the polygon mirror 301 may have a shape similar to a cube, cuboid, or rectangular prism. Additionally, the polygon mirror 301 may have a total of six sides, where four of the sides include faces with reflective surfaces (320A, 320B, 320C, and 320D).

In particular embodiments, a polygon mirror 301 may be continuously rotated in a clockwise or counter-clockwise rotation direction about a rotation axis of the polygon mirror 301. The rotation axis may correspond to a line that is perpendicular to the plane of rotation of the polygon mirror 301 and that passes through the center of mass of the polygon mirror 301. In FIG. 3, the polygon mirror 301 rotates in the plane of the drawing, and the rotation axis of the polygon mirror 301 is perpendicular to the plane of the drawing. An electric motor may be configured to rotate a polygon mirror 301 at a substantially fixed frequency (e.g., a rotational frequency of approximately 1 Hz (or 1 revolution per second), 10 Hz, 50 Hz, 100 Hz, 500 Hz, or 1,000 Hz). As an example, a polygon mirror 301 may be mechanically coupled to an electric motor (e.g., a synchronous electric motor) which is configured to spin the polygon mirror 301 at a rotational speed of approximately 160 Hz (or, 9600 revolutions per minute (RPM)).

In particular embodiments, output beam 125 may be reflected sequentially from the reflective surfaces 320A, 320B, 320C, and 320D as the polygon mirror 301 is rotated. This results in the output beam 125 being scanned along a particular scan axis (e.g., a horizontal or vertical scan axis) to produce a sequence of scan lines, where each scan line corresponds to a reflection of the output beam 125 from one of the reflective surfaces of the polygon mirror 301. In FIG. 3, the output beam 125 reflects off of reflective surface 320A to produce one scan line. Then, as the polygon mirror 301 rotates, the output beam 125 reflects off of reflective surfaces 320B, 320C, and 320D to produce a second, third, and fourth respective scan line. In particular embodiments, a lidar system 100 may be configured so that the output beam 125 is first reflected from polygon mirror 301 and then from scan mirror 302 (or vice versa). As an example, an output beam 125 from light source 110 may first be directed to polygon mirror 301, where it is reflected by a reflective surface of the polygon mirror 301, and then the output beam 125 may be directed to scan mirror 302, where it is reflected by reflective surface 320 of the scan mirror 302. In the example of FIG. 3, the output beam 125 is reflected from the polygon mirror 301 and the scan mirror 302 in the reverse order. In FIG. 3, the output beam 125 from light source 110 is first directed to the scan mirror 302, where it is reflected by reflective surface 320, and then the output beam 125 is directed to the polygon mirror 301, where it is reflected by reflective surface 320A.

Figure 4:
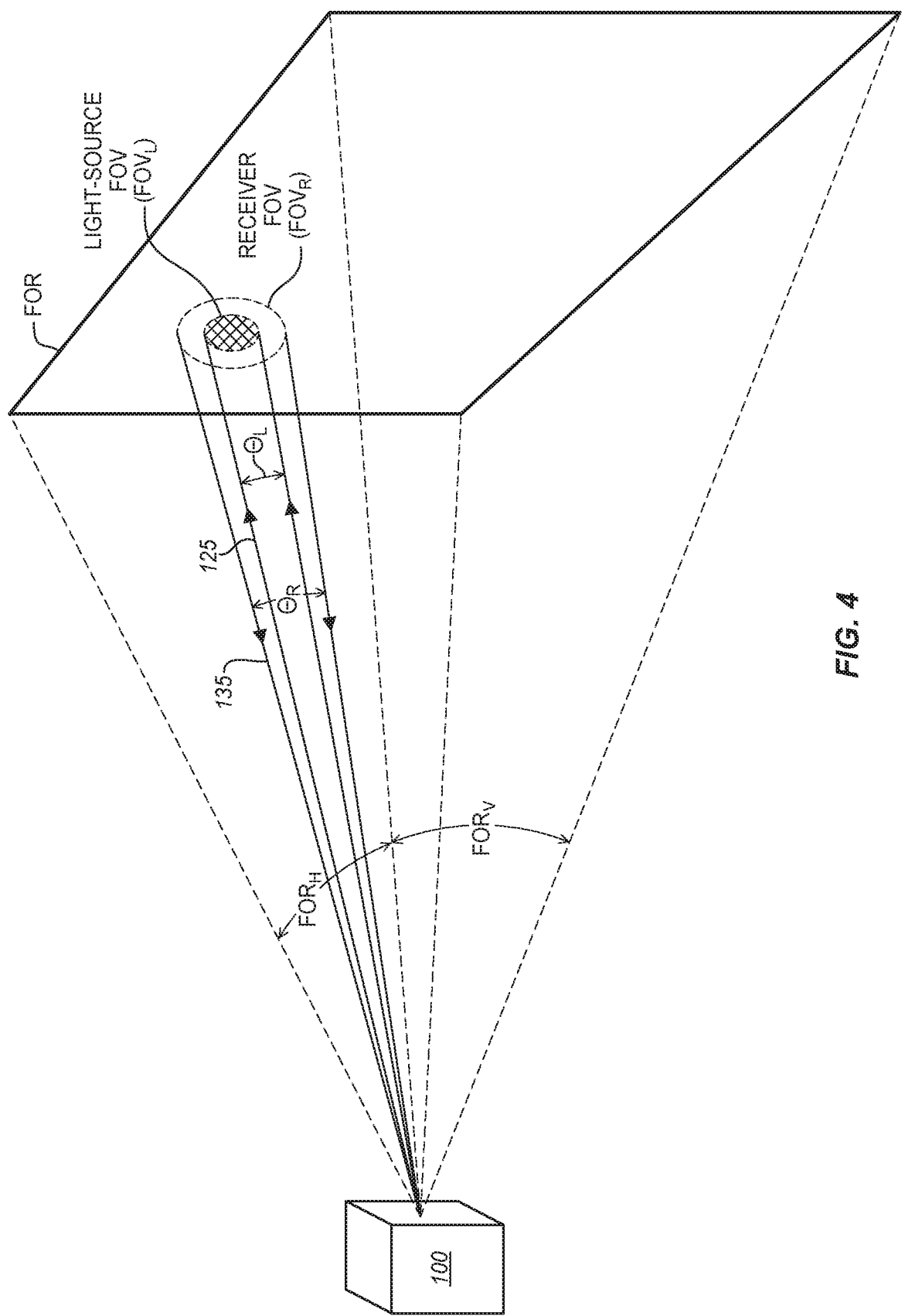
FIG. 4 illustrates an example light-source field of view ($FOV_L$) and receiver field of view ($FOV_R$) for a lidar system.

FIG. 4 illustrates an example light-source field of view ($FOV_L$) and receiver field of view ($FOV_R$) for a lidar system 100. A light source 110 of lidar system 100 may emit pulses of light as the $FOV_L$ and $FOV_R$ are scanned by scanner 120 across a field of regard (FOR). In particular embodiments, a light-source field of view may refer to an angular cone illuminated by the light source 110 at a particular instant of time. Similarly, a receiver field of view may refer to an angular cone over which the receiver 140 may receive or detect light at a particular instant of time, and any light outside the receiver field of view may not be received or detected. As an example, as the light-source field of view is scanned across a field of regard, a portion of a pulse of light emitted by the light source 110 may be sent downrange from lidar system 100, and the pulse of light may be sent in the direction that the $FOV_L$ is pointing at the time the pulse is emitted. The pulse of light may scatter off a target 130, and the receiver 140 may receive and detect a portion of the scattered light that is directed along or contained within the $FOV_R$.

In particular embodiments, scanner 120 may be configured to scan both a light-source field of view and a receiver field of view across a field of regard of the lidar system 100. Multiple pulses of light may be emitted and detected as the scanner 120 scans the $FOV_L$ and $FOV_R$ across the field of regard of the lidar system 100 while tracing out a scan pattern 200. In particular embodiments, the light-source field of view and the receiver field of view may be scanned synchronously with respect to one another, so that as the $FOV_L$ is scanned across a scan pattern 200, the $FOV_R$ follows substantially the same path at the same scanning speed. Additionally, the $FOV_L$ and $FOV_R$ may maintain the same relative position to one another as they are scanned across the field of regard. As an example, the $FOV_L$ may be substantially overlapped with or centered inside the $FOV_R$ (as illustrated in FIG. 4), and this relative positioning between $FOV_L$ and $FOV_R$ may be maintained throughout a scan. As another example, the $FOV_R$ may lag behind the $FOV_L$ by a particular, fixed amount throughout a scan (e.g., the $FOV_R$ may be offset from the $FOV_L$ in a direction opposite the scan direction).

In particular embodiments, the $FOV_L$ may have an angular size or extent $\Theta_L$ that is substantially the same as or that corresponds to the divergence of the output beam 125, and the $FOV_R$ may have an angular size or extent $\Theta_R$ that corresponds to an angle over which the receiver 140 may receive and detect light. In particular embodiments, the receiver field of view may be any suitable size relative to the light-source field of view. As an example, the receiver field of view may be smaller than, substantially the same size as, or larger than the angular extent of the light-source field of view. In particular embodiments, the light-source field of view may have an angular extent of less than or equal to 50 milliradians, and the receiver field of view may have an angular extent of less than or equal to 50 milliradians. The $FOV_L$ may have any suitable angular extent $\Theta_L$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. Similarly, the $FOV_R$ may have any suitable angular extent $\Theta_R$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. In particular embodiments, the light-source field of view and the receiver field of view may have approximately equal angular extents. As an example, $\Theta_L$ and $\Theta_R$ may both be approximately equal to 1 mrad, 2 mrad, or 4 mrad. In particular embodiments, the receiver field of view may be larger than the light-source field of view, or the light-source field of view may be larger than the receiver field of view. As an example, $\Theta_L$ may be approximately equal to 3 mrad, and $\Theta_R$ may be approximately equal to 4 mrad. As another example, $\Theta_R$ may be approximately L times larger than $\Theta_L$, where L is any suitable factor, such as for example, 1.1, 1.2, 1.5, 2, 3, 5, or 10.

In particular embodiments, a pixel 210 may represent or may correspond to a light-source field of view or a receiver field of view. As the output beam 125 propagates from the light source 110, the diameter of the output beam 125 (as well as the size of the corresponding pixel 210) may increase according to the beam divergence $\Theta_L$. As an example, if the output beam 125 has a $\Theta_L$ of 2 mrad, then at a distance of 100 m from the lidar system 100, the output beam 125 may have a size or diameter of approximately 20 cm, and a corresponding pixel 210 may also have a corresponding size or diameter of approximately 20 cm. At a distance of 200 m from the lidar system 100, the output beam 125 and the corresponding pixel 210 may each have a diameter of approximately 40 cm.

Figure 5:
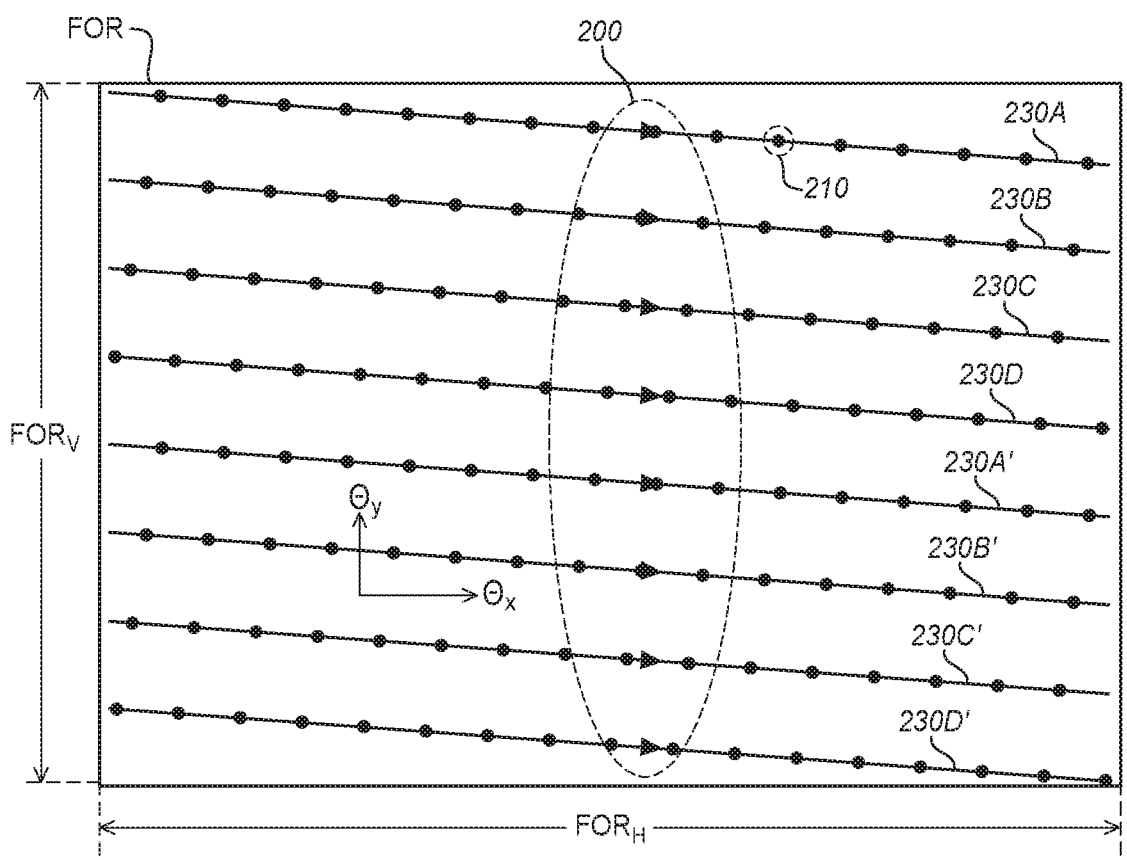
FIG. 5 illustrates an example unidirectional scan pattern that includes multiple pixels and multiple scan lines.

FIG. 5 illustrates an example unidirectional scan pattern 200 that includes multiple pixels 210 and multiple scan lines 230. In particular embodiments, scan pattern 200 may include any suitable number of scan lines 230 (e.g., approximately 1, 2, 5, 10, 20, 50, 100, 500, or 1,000 scan lines), and each scan line 230 of a scan pattern 200 may include any suitable number of pixels 210 (e.g., 1, 2, 5, 10, 20, 50, 100, 200, 500, 1,000, 2,000, or 5,000 pixels). The scan pattern 200 illustrated in FIG. 5 includes eight scan lines 230, and each scan line 230 includes approximately 16 pixels 210. In particular embodiments, a scan pattern 200 where the scan lines 230 are scanned in two directions (e.g., alternately scanning from right to left and then from left to right) may be referred to as a bidirectional scan pattern 200, and a scan pattern 200 where the scan lines 230 are scanned in the same direction may be referred to as a unidirectional scan pattern 200. The scan pattern 200 in FIG. 5 may be referred to as a unidirectional scan pattern 200 where each scan line 230 travels across the FOR in substantially the same direction (e.g., approximately from left to right as viewed from the lidar system 100). In particular embodiments, scan lines 230 of a unidirectional scan pattern 200 may be directed across a FOR in any suitable direction, such as for example, from left to right, from right to left, from top to bottom, from bottom to top, or at any suitable angle (e.g., at a 0°, 5°, 10°, 30°, or 45° angle) with respect to a horizontal or vertical axis. In particular embodiments, each scan line 230 in a unidirectional scan pattern 200 may be a separate line that is not directly connected to a previous or subsequent scan line 230.

In particular embodiments, a unidirectional scan pattern 200 may be produced by a scanner 120 that includes a polygon mirror (e.g., polygon mirror 301 of FIG. 3), where each scan line 230 is associated with a particular reflective surface 320 of the polygon mirror. As an example, reflective surface 320A of polygon mirror 301 in FIG. 3 may produce scan line 230A in FIG. 5. Similarly, as the polygon mirror 301 rotates, reflective surfaces 320B, 320C, and 320D may successively produce scan lines 230B, 230C, and 230D, respectively. Additionally, for a subsequent revolution of the polygon mirror 301, the scan lines 230A', 230B', 230C', and 230D' may be successively produced by reflections of the output beam 125 from reflective surfaces 320A, 320B, 320C, and 320D, respectively. In particular embodiments, N successive scan lines 230 of a unidirectional scan pattern 200 may correspond to one full revolution of a N-sided polygon mirror. As an example, the four scan lines 230A, 230B, 230C, and 230D in FIG. 5 may correspond to one full revolution of the four-sided polygon mirror 301 in FIG. 3. Additionally, a subsequent revolution of the polygon mirror 301 may produce the next four scan lines 230A', 230B', 230C', and 230D' in FIG. 5.

Figure 6:
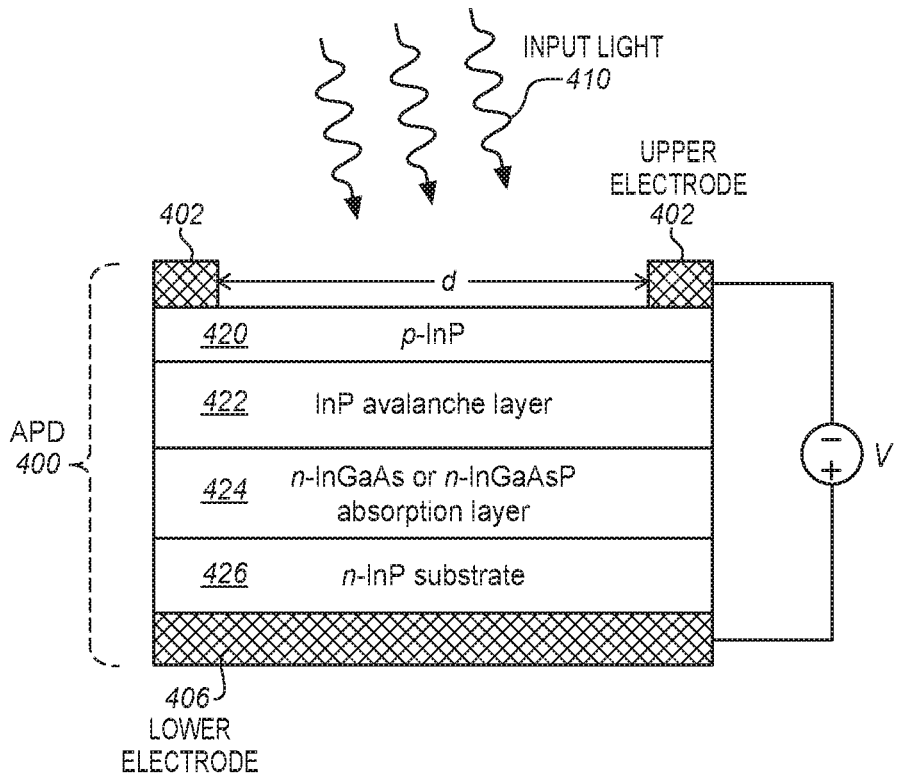
FIG. 6 illustrates an example InGaAs avalanche photodiode which can operate in the lidar system of FIG. 1.

FIG. 6 illustrates an example InGaAs avalanche photodiode (APD) 400. Referring back to FIG. 1, the receiver 140 may include one or more APDs 400 configured to receive and detect light from input light such as the beam 135. More generally, the APD 400 can operate in any suitable receiver of input light. The APD 400 may be configured to detect a portion of pulses of light which are scattered by a target located downrange from the lidar system in which the APD 400 operates. For example, the APD 400 may receive a portion of a pulse of light scattered by the target 130 depicted in FIG. 1, and generate an electrical-current signal corresponding to the received pulse of light.

The APD 400 may include doped or undoped layers of any suitable semiconductor material, such as for example, silicon, germanium, InGaAs, InGaAsP, or indium phosphide (InP). Additionally, the APD 400 may include an upper electrode 402 and a lower electrode 406 for coupling the ADP 400 to an electrical circuit. The APD 400 for example may be electrically coupled to a voltage source that supplies a reverse-bias voltage V to the APD 400. Additionally, the APD 400 may be electrically coupled to a transimpedance amplifier which receives electrical current generated by the APD 400 and produces an output voltage signal that corresponds to the received current. The upper electrode 402 or lower electrode 406 may include any suitable electrically conductive material, such as for example a metal (e.g., gold, copper, silver, or aluminum), a transparent conductive oxide (e.g., indium tin oxide), a carbon-nanotube material, or polysilicon. In some implementations, the upper electrode 402 is partially transparent or has an opening to allow input light 410 to pass through to the active region of the APD 400. In FIG. 6, the upper electrode 402 may have a ring shape that at least partially surrounds the active region of the APD 400, where the active region refers to an area over which the APD 400 may receive and detect the input light 410. The active region may have any suitable size or diameter d, such as for example, a diameter of approximately 25 µm, 50 µm, 80 µm, 100 µm, 200 µm, 500 µm, 1 mm, 2 mm, or 5 mm.

The APD 400 may include any suitable combination of any suitable semiconductor layers having any suitable doping (e.g., n-doped, p-doped, or intrinsic undoped material). In the example of FIG. 6, the InGaAs APD 400 includes a p-doped InP layer 420, an InP avalanche layer 422, an absorption layer 424 with n-doped InGaAs or InGaAsP, and an n-doped InP substrate layer 426. Depending on the implementation, the APD 400 may include separate absorption and avalanche layers, or a single layer may act as both an absorption and avalanche region. The APD 400 may operate electrically as a PN diode or a PIN diode, and, during operation, the APD 400 may be reverse-biased with a positive voltage V applied to the lower electrode 406 with respect to the upper electrode 402. The applied reverse-bias voltage V may have any suitable value, such as for example approximately 5 V, 10 V, 20 V, 30 V, 50 V, 75 V, 100 V, or 200 V.

In FIG. 6, photons of the input light 410 may be absorbed primarily in the absorption layer 424, resulting in the generation of electron-hole pairs (which may be referred to as photo-generated carriers). For example, the absorption layer 424 may be configured to absorb photons corresponding to the operating wavelength of the lidar system 100 (e.g., any suitable wavelength between approximately 1400 nm and approximately 1600 nm). In the avalanche layer 422, an avalanche-multiplication process occurs where carriers (e.g., electrons or holes) generated in the absorption layer 424 collide with the semiconductor lattice of the absorption layer 424, and produce additional carriers through impact ionization. This avalanche process can repeat numerous times so that one photo-generated carrier may result in the generation of multiple carriers. As an example, a single photon absorbed in the absorption layer 424 may lead to the generation of approximately 10, 50, 100, 200, 500, 1000, 10,000, or any other suitable number of carriers through an avalanche-multiplication process. The carriers generated in an APD 400 may produce an electrical current that is coupled to an electrical circuit which may perform, for example, signal amplification, sampling, filtering, signal conditioning, analog-to-digital conversion, time-to-digital conversion, pulse detection, threshold detection, rising-edge detection, or falling-edge detection.

The number of carriers generated from a single photo-generated carrier may increase as the applied reverse bias V is increased. If the applied reverse bias V is increased above a particular value referred to as the APD breakdown voltage, then a single carrier can trigger a self-sustaining avalanche process (e.g., the output of the APD 400 is saturated regardless of the input light level). The APD 400 that is operated at or above a breakdown voltage may be referred to as a single-photon avalanche diode (SPAD) and may be referred to as operating in a Geiger mode or a photon-counting mode. The APD 400 that is operated below a breakdown voltage may be referred to as a linear APD, and the output current generated by the APD 400 may be sent to an amplifier circuit (e.g., a transimpedance amplifier). The receiver 140 (see FIG. 1) may include an APD configured to operate as a SPAD and a quenching circuit configured to reduce a reverse-bias voltage applied to the SPAD when an avalanche event occurs in the SPAD. The APD 400 configured to operate as a SPAD may be coupled to an electronic quenching circuit that reduces the applied voltage V below the breakdown voltage when an avalanche-detection event occurs. Reducing the applied voltage may halt the avalanche process, and the applied reverse-bias voltage may then be re-set to await a subsequent avalanche event. Additionally, the APD 400 may be coupled to a circuit that generates an electrical output pulse or edge when an avalanche event occurs.

In some implementations, the APD 400 or the APD 400 along with transimpedance amplifier have a noise-equivalent power (NEP) that is less than or equal to 100 photons, 50 photons, 30 photons, 20 photons, or 10 photons. For example, the APD 400 may be operated as a SPAD and may have a NEP of less than or equal to 20 photons. As another example, the APD 400 may be coupled to a transimpedance amplifier that produces an output voltage signal with a NEP of less than or equal to 50 photons. The NEP of the APD 400 is a metric that quantifies the sensitivity of the APD 400 in terms of a minimum signal (or a minimum number of photons) that the APD 400 can detect. The NEP may correspond to an optical power (or to a number of photons) that results in a signal-to-noise ratio of 1, or the NEP may represent a threshold number of photons above which an optical signal may be detected. For example, if the APD 400 has a NEP of 20 photons, then the input beam 410 with 20 photons may be detected with a signal-to-noise ratio of approximately 1 (e.g., the APD 400 may receive 20 photons from the input beam 410 and generate an electrical signal representing the input beam 410 that has a signal-to-noise ratio of approximately 1). Similarly, the input beam 410 with 100 photons may be detected with a signal-to-noise ratio of approximately 5. In some implementations, the lidar system 100 with the APD 400 (or a combination of the APD 400 and transimpedance amplifier) having a NEP of less than or equal to 100 photons, 50 photons, 30 photons, 20 photons, or 10 photons offers improved detection sensitivity with respect to a conventional lidar system that uses a PN or PIN photodiode. For example, an InGaAs PIN photodiode used in a conventional lidar system may have a NEP of approximately $10^4$ to $10^5$ photons, and the noise level in a lidar system with an InGaAs PIN photodiode may be $10^3$ to $10^4$ times greater than the noise level in a lidar system 100 with the InGaAs APD detector 400.

Referring back to FIG. 1, an optical filter may be located in front of the receiver 140 and configured to transmit light at one or more operating wavelengths of the light source 110 and attenuate light at surrounding wavelengths. For example, an optical filter may be a free-space spectral filter located in front of APD 400 of FIG. 6. This spectral filter may transmit light at the operating wavelength of the light source 110 (e.g., between approximately 1530 nm and 1560 nm) and attenuate light outside that wavelength range. As a more specific example, light with wavelengths of approximately 400-1530 nm or 1560-2000 nm may be attenuated by any suitable amount, such as for example, by at least 5 dB, 10 dB, 20 dB, 30 dB, or 40 dB.

Figure 7:
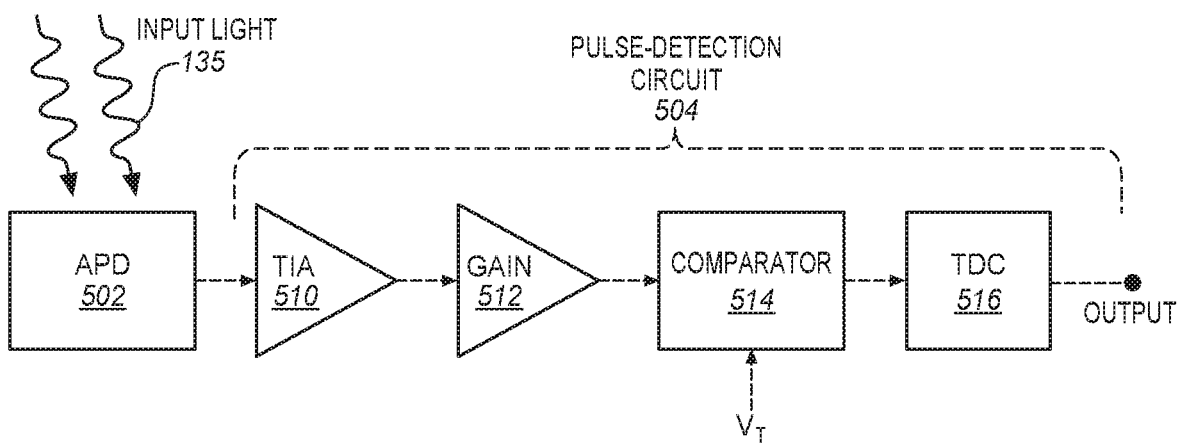
FIG. 7 illustrates an example photodiode coupled to a pulse-detection circuit, which can operate in the lidar system of FIG. 1.

Next, FIG. 7 illustrates an APD 502 coupled to an example pulse-detection circuit 504. The APD 502 can be similar to the APD 400 discussed above with reference to FIG. 6, or can be any other suitable detector. The pulse-detection circuit 504 can operate in the lidar system of FIG. 1 as part of the receiver 140 or any other suitable receiver. The pulse-detection circuit 504 alternatively can be implemented in the controller 150 or another suitable controller. In some implementations, parts of the pulse-detection circuit 504 can operate in a receiver and other parts of the pulse-detection circuit 504 can operate in a controller. For example, components 510 and 512 may be a part of the receiver 140, and components 514 and 516 may be a part of the controller 150.

The pulse-detection circuit 504 may include circuitry that receives a signal from a detector (e.g., an electrical current from the APD 502) and performs current-to-voltage conversion, signal amplification, sampling, filtering, signal conditioning, analog-to-digital conversion, time-to-digital conversion, pulse detection, threshold detection, rising-edge detection, or falling-edge detection, as examples. The pulse-detection circuit 504 may determine whether an optical pulse has been received by the APD 502 or may determine a time associated with receipt of an optical pulse by the APD 502. Additionally, the pulse-detection circuit 504 may determine a duration of a received optical pulse. In an example implementation, the pulse-detection circuit 504 includes a transimpedance amplifier (TIA) 510, a gain circuit 512, a comparator 514, and a time-to-digital converter (TDC) 516.

The TIA 510 may be configured to receive an electrical-current signal from the APD 502 and produce a voltage signal that corresponds to the received electrical-current signal. For example, in response to a received optical pulse, the APD 502 may produce a current pulse corresponding to the optical pulse. The TIA 510 may receive the current pulse from the APD 502 and produce a voltage pulse that corresponds to the received current pulse. The TIA 510 may also act as an electronic filter. For example, the TIA 510 may be configured as a low-pass filter that removes or attenuates high-frequency electrical noise by attenuating signals above a particular frequency (e.g., above 1 MHz, 10 MHz, 20 MHz, 50 MHz, 100 MHz, 200 MHz, or any other suitable frequency).

The gain circuit 512 may be configured to amplify a voltage signal. As an example, the gain circuit 512 may include one or more voltage-amplification stages that amplify a voltage signal received from the TIA 510. For example, the gain circuit 512 may receive a voltage pulse from the TIA 510, and the gain circuit 512 may amplify the voltage pulse by any suitable amount, such as for example, by a gain of approximately 3 dB, 10 dB, 20 dB, 30 dB, 40 dB, or 50 dB. Additionally, the gain circuit 512 may also act as an electronic filter configured to remove or attenuate electrical noise.

The comparator 514 may be configured to receive a voltage signal from the TIA 510 or the gain circuit 512 and produce an electrical-edge signal (e.g., a rising edge or a falling edge) when the received voltage signal rises above or falls below a particular threshold voltage VT. As an example, when a received voltage rises above VT, the comparator 514 may produce a rising-edge digital-voltage signal (e.g., a signal that steps from approximately 0 V to approximately 2.5 V, 3.3 V, 5 V, or any other suitable digital-high level). As another example, when a received voltage falls below VT, the comparator 514 may produce a falling-edge digital-voltage signal (e.g., a signal that steps down from approximately 2.5 V, 3.3 V, 5 V, or any other suitable digital-high level to approximately 0 V). The voltage signal received by the comparator 514 may be received from the TIA 510 or the gain circuit 512 and may correspond to an electrical-current signal generated by the APD 502. For example, the voltage signal received by the comparator 514 may include a voltage pulse that corresponds to an electrical-current pulse produced by the APD 502 in response to receiving an optical pulse. The voltage signal received by the comparator 514 may be an analog signal, and an electrical-edge signal produced by the comparator 514 may be a digital signal.

The time-to-digital converter (TDC) 516 may be configured to receive an electrical-edge signal from the comparator 514 and determine an interval of time between emission of a pulse of light by the light source and receipt of the electrical-edge signal. The output of the TDC 516 may be a numerical value that corresponds to the time interval determined by the TDC 516. In some implementations, the TDC 516 has an internal counter or clock with any suitable period, such as for example, 5 ps, 10 ps, 15 ps, 20 ps, 30 ps, 50 ps, 100 ps, 0.5 ns, 1 ns, 2 ns, 5 ns, or 10 ns. The TDC 516 for example may have an internal counter or clock with a 20 ps period, and the TDC 516 may determine that an interval of time between emission and receipt of a pulse is equal to 25,000 time periods, which corresponds to a time interval of approximately 0.5 microseconds. Referring back to FIG. 1, the TDC 516 may send the numerical value "25000" to a processor or controller 150 of the lidar system 100, which may include a processor configured to determine a distance from the lidar system 100 to the target 130 based at least in part on an interval of time determined by a TDC 516. The processor may receive a numerical value (e.g., "25000") from the TDC 516 and, based on the received value, the processor may determine the distance from the lidar system 100 to a target 130.

In one case, a lidar system includes a transmitter with a light source that generates a laser light at an intrinsically eye-safe wavelength, e.g., 1550 nm, and a receiver with a linear-mode avalanche photodiode (APD) detector. Relative to the 905 nm wavelength, where other automotive LIDAR systems typically operate, there is an increase in the number of photons per mW of energy at the 1550 nm wavelength. Moreover, the 1550 nm wavelength is better suited for complying with eye safety requirements. Generally speaking, the system uses a linear-mode avalanche detector (the APD) to better take advantage of the increased number of photons returned from the reflected target at the 1550 nm wavelength. Contrary to typical single-photon detectors currently used in automotive lidar systems (which produce a fixed output upon the detection of a "single" photon), the linear-mode avalanche detector produces an output that is dependent on (e.g., is proportional to) the number of photons incident on the detector in a particular time period. The use of this type of detector enables the detection of rising and falling edge, intensity, and amplitude characteristics of the returned pulse, which provides for longer range detection and a more robust and accurate detection system.

As noted above, the use of a linear-mode APD (for example at approximately the 1550 nm wavelength) provides the opportunity to perform enhanced detection activities on the received reflected light pulse from a target. It will be noted that, while these systems are described as using a transmitter that transmits light pulses at approximately the 1550 nm wavelength, the transmitter could transmit at other wavelengths instead (or as well in a multiple wavelength system). For example, the transmitter could transmit pulses at a wavelength below approximately 1900 nanometers, at a wavelength between approximately 1500 nanometers and 1600 nanometers, at a wavelength above approximately 1100 nanometers, above 1400 nanometers, in a range between 1400 and 1900 nanometers, in a range between 1530 and 1580 nanometers, etc. In these cases, the system may use a linear-mode APD formed as a Indium-Gallium-Arsenide (InGaAs) semi-conductor material. Still further, in some instances, the systems described below could use a transmitter that transmits light pulses having wavelengths below 1100 nanometers, such as between 900 and 1000 nanometers, at approximately 950 nanometers, etc. In these cases, the systems may use an APD formed as a silicon semi-conductor material.

Figure 8:
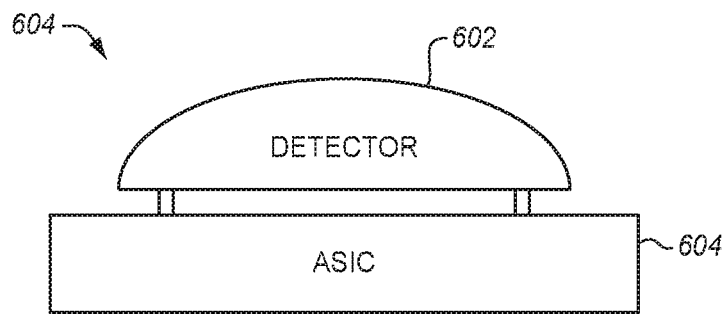
FIG. 8 illustrates a receiver having a lidar detector disposed directly on an application specific integrated circuit (ASIC) that processes light detection signals generated by the receiver.

Generally, FIG. 8 illustrates a block diagram of a receiver 600 configured as a light detector 602, which may be, for example, an APD or other detector 400 illustrated in FIG. 6, disposed directly on an application-specific integrated circuit (ASIC) 604. In this case, the ASIC 604 is an integrated circuit having circuitry thereon that processes the electrical signals produced by the light detector 602 in response to detecting light signals. The light detector 602 may be mounted directly on the ASIC 604 and may have any output that is electrically connected to an input of the ASIC 604. More particularly, FIG. 8 illustrates a light detector 602 that is directly bump-bonded to the ASIC 604 which may include or be configured to include a readout integrated circuit (ROIC). Generally speaking, an ASIC is any integrated circuit (IC) customized for a particular use while a ROIC is a specific type of ASIC designed for reading/processing signals from detectors. For example, the light detector 602 may be configured as a CCD array coupled to a ROIC that receives and accumulates charge from each pixel of the CCD. The ROIC may then provide an output signal to a circuit (e.g., other parts of the ASIC 604) for readout (to determine the amount of accumulated charge). The ROIC described here, however, may be different than a traditional ROIC, as the ROIC in the system of FIG. 8 may do much more than accumulate charge and provide a readout value. Here, the ROIC performs current-to-voltage conversion (with the TIA), voltage amplification, filtering, edge/level detection, timing, and TDC (time-to-digital conversion). As a result, the terms ASIC and ROIC may be used interchangeably in this description.

Still further, the detector 602 is electrically (and mechanically) connected to the ASIC 604 by "bump bonding" where a small ball of solder is attached to a surface to form a solder "bump." For example, the bumps may be attached to solder pads of the ASIC 604, and the corresponding connectors of the detector package may then be brought into contact with the bumps. The two devices are then "bump bonded" (or, soldered) together by heating, to allow the solder bumps to reflow. Bump bonding has advantages over other types of electrical connectors, including smaller overall size (e.g., compared to connecting the ASIC and detector with wire or wire bonding), better reliability, higher electrical speed (the shorter distance provided by the bump bond has lower parasitic capacitance or inductance), and less electrical noise (the signal travels a relatively short distance from the detector to the ASIC, which means there is less chance for the signal to become degraded or corrupted by picking up noise).

Figure 9:
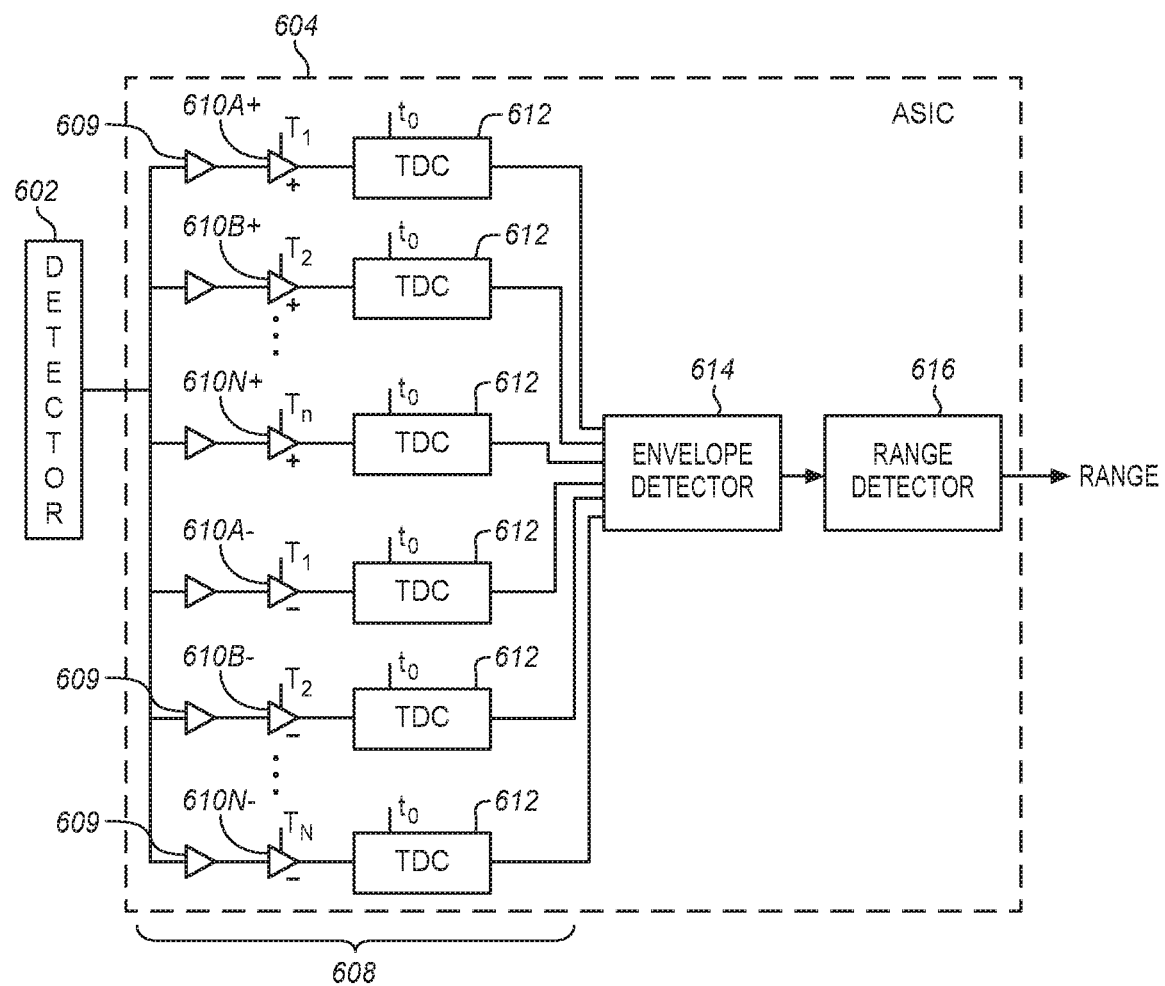
FIG. 9 illustrates an example lidar detector system that includes a plurality of time to digital convertors (TDCs) to enable enhanced pulse envelope and range detection.

FIG. 9 illustrates the receiver 600 of FIG. 8 in more detail and, in particular, depicts an example set of circuitry that may be disposed on the ASIC 604 of the receiver 600 of FIG. 8. In particular, FIG. 9 illustrates the detector 602, which may be any suitable light detector as described herein, coupled directly to the ASIC 604. The circuitry of the ASIC 604 is illustrated in block diagram form in FIG. 9, but it will be understood that this circuitry may be disposed in any suitable manner on an integrated circuit, such as one that is silicon based. In any event, the output of the detector 602 includes one or more electrical signals produced as a result of the detection of light or photons arriving in the detector 602, and which are referred to herein as light detection signals. These light detection signals are provided to a set of parallel connected amplitude detection circuits 608 on the ASIC 604. Each of the parallel connected amplitude detection circuits 608 is illustrated as including an amplifier 609, a comparator 610 and a time-to-digital converter (TDC) 612. The output of each of the amplitude detection circuits 608 is provided to an envelope detection circuit 614, which has one or more outputs connected to a range detection circuit 616. An amplitude detection circuit 608, which may include a comparator 610 and a TDC 612, may be referred to as an amplitude detector, a magnitude detection circuit, or a magnitude detector.

More particularly, the amplifiers 609 amplify the light detection signals from the light detector 602 and provide an amplified signal to a comparator 610. While the circuitry of FIG. 9 is illustrated as including a separate amplifier 609 disposed in each of the parallel connected amplitude detection circuits 608, one or more amplifiers (e.g., a TIA 510 and/or a gain circuit 512) could be configured to amplify the light detection signals from the detector 602 prior to the light detection signals being split and provided to the separate amplitude detection circuits 608. In any event, the output of each of the amplifiers 609 is provided to an associated comparator 610 which compares the amplified light detection signal to a particular threshold value and outputs a positive or other signal indicating when the comparison criteria is met. In this case, a separate comparator (labeled 610A, 610B, . . . 610N) is illustrated as being disposed in each of the amplitude detection circuits 608. More particularly, each of the comparators 610 receives an input threshold signal T, indicated more specifically by a reference number $T_1, T_2, \ldots T_n$, and compares the amplified light signal to the associated threshold value. Preferably, each of the threshold signals $T_1$-$T_n$ is a different value ranging from a minimum to a maximum value, and these thresholds T will be various values within the expected range of the detected amplitudes of the light detection signals produced by the detector 602. Some or all of the threshold values T may range linearly (e.g., may be equally spaced apart), or may range non-linearly (e.g., be non-equally spaced apart). There may be, for example, more threshold values at the top of the amplitude detection range, at the bottom or lower part of the amplitude detection range, in the middle of the amplitude detection range, etc. Still further, any number of amplitude detection circuits 608 (and associated comparators 610 and TDCs 612) may be provided in the ASIC 604. Generally speaking, the more amplitude detection circuits that are provided, the greater or better envelope detection that can be performed by the envelope detector 614.

Figure 13:
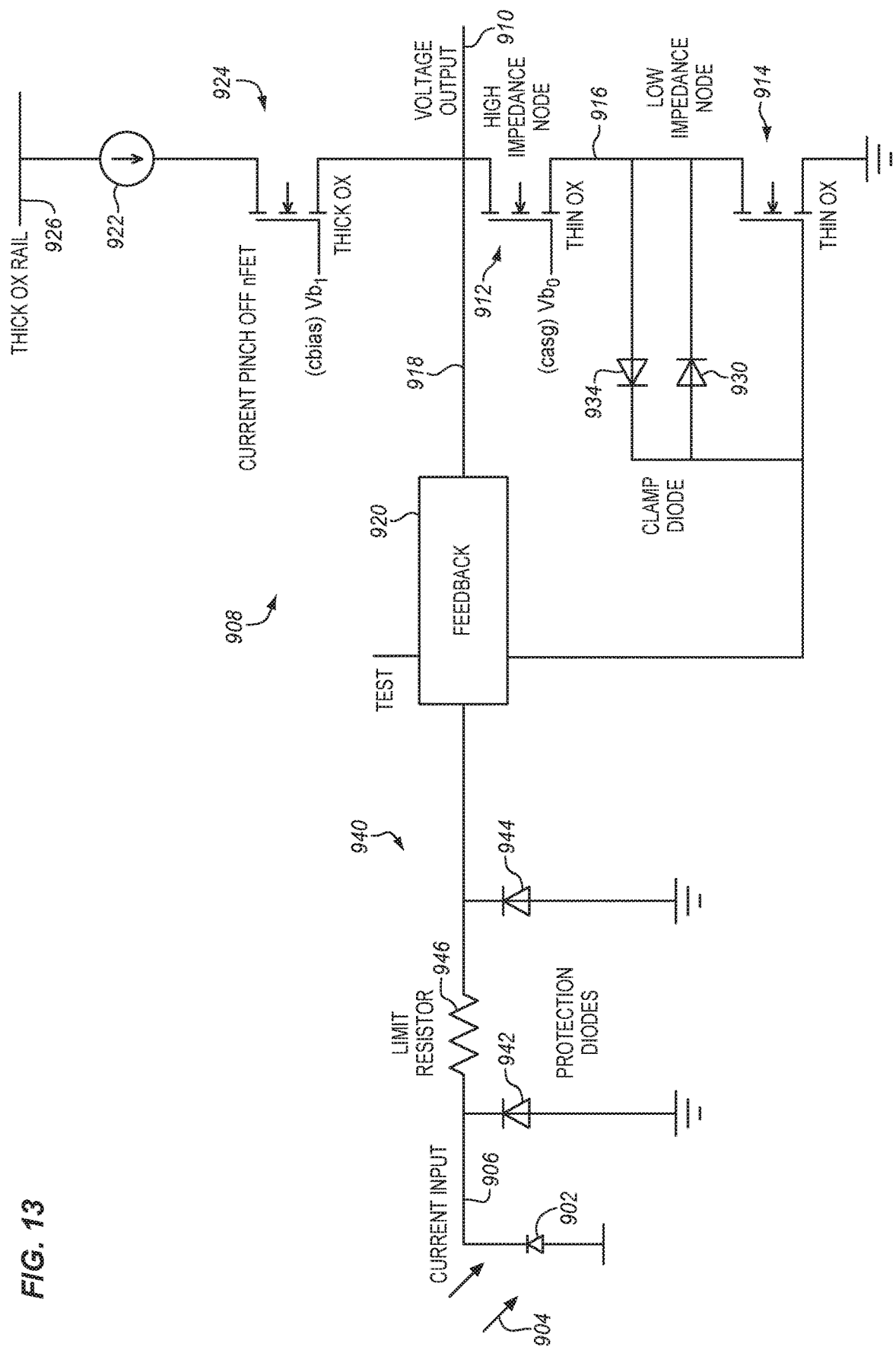
FIG. 13 illustrates another alternative circuit with protection for an amplifier.

Still further, as illustrated in FIG. 9, there may be two amplitude detection circuits 608 associated with each particular threshold value ($T_1$, for example). In particular, there are two types of comparators 610, including rising-edge comparators, indicated with a plus sign (+), and falling-edge comparators, indicated with a minus sign (−). As will be understood, rising-edge comparators determine when the amplified light detection signal provided at the input thereto reaches or rises above the threshold T going in a positive or rising direction (that is, reaches the threshold from a lower value). On the other hand, falling-edge comparators determine or detect when the amplified light detection signals at the input thereto reach or fall below the associated threshold T in the negative or falling direction (that is, reach the threshold from a higher value). Thus, the comparator 610A+ provides a comparison between the incoming light detection signal to the threshold $T_1$, and determines when the incoming light detection signal reaches the level of threshold $T_1$ going in a positive direction, while the comparator 610A− determines when the light signal reaches the threshold $T_1$ going in the negative or falling direction. Upon making a determination that the light detection signal meets the associated threshold from the correct direction, the comparator produces an output signal that indicates such a condition (i.e., that the comparison criteria is met). As illustrated in FIG. 13, the output signal of each comparator 610, which may be a direct current (DC) signal, a rising-edge or falling-edge signal, or a digital bit indicative of the status of the comparison (e.g., met or not met), is provided to an associated TDC 612.

As explained above, each TDC (including the TDCs 612) includes a very precise and high-speed counter or timer, and the TDCs 612 clock, store, and/or output the value or values of the associated timer when the TDC 612 receives an appropriate (e.g., positive) input from the associated comparator 610. Moreover, each of the TDCs 612 receives a timing initialization signal $t_0$, which may generally indicate the time at which the lidar system transmitter generated and/or transmitted a light pulse associated with the current field of regard of the current scan. This initial timing signal to may be provided as an electrical signal from a controller that controls the transmitter, by a sensor which senses when the light pulse is actually transmitted from the transmitter, etc. Moreover, the timing initialization signal to may be generated by the transmitter based on or to coincide with the rising edge of the transmitted light pulse, the falling edge of the transmitted light pulse, the peak or center of the transmitted light pulse or any other desired point or location on the transmitted light pulse. Thus, as will be understood, the TDCs 612 reset and start the counters when they receive the to initialization signal, and clock or store the counter value as a digital output signal when receiving a signal from an associated comparator 610 that the detected incoming light pulse has reach a certain threshold T in a rising or falling direction. The TDCs 612 may output a digital signal indicating the one or more times that the incoming light detection signal met the threshold in the appropriate direction and these output signals are provided to the envelope detector 614.

Of course, all of the TDCs 612 operate in parallel with one another simultaneously so that the various amplitude detection circuits 608 determine the various different times (relative to the time $t_0$) at which a detected light pulse reaches various amplitudes associated with the thresholds $T_1$-$T_n$ in the rising and falling directions.

In some embodiments, an ASIC 604 may include an analog-to-digital converter (ADC). As an example, rather than using a parallel arrangement of multiple TDCs, the ASIC 604 may include an ADC configured to produce a digital representation of a received pulse. The ADC may be located after the transimpedance amplifier 510 or the gain circuit 512 in FIG. 7 and may produce a series of points corresponding to the envelope of a received pulse (similar to that illustrated in FIG. 10).

Figure 10:
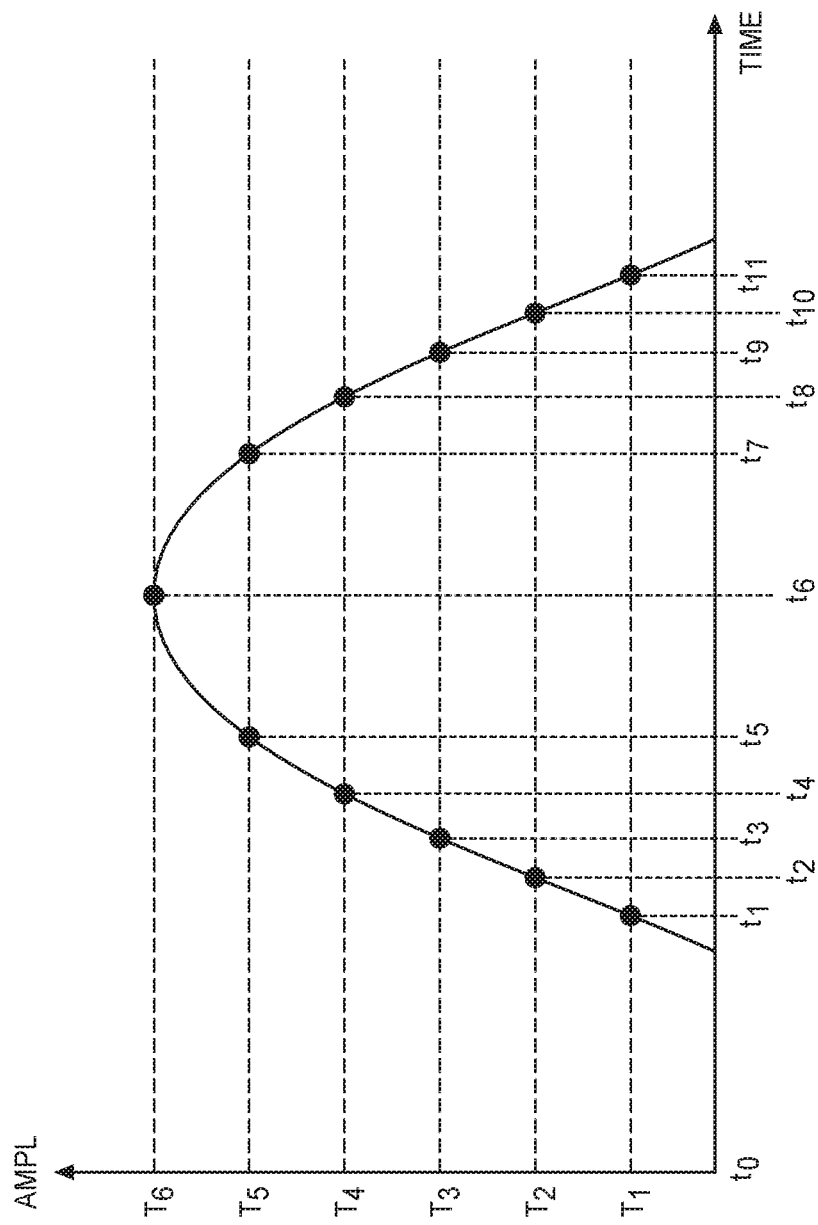
FIG. 10 illustrates an example plot of detection points that may be produced by the envelope detector of FIG. 9.

As noted above, the envelope detector 614 receives the outputs of the TDCs 612 and analyzes these signals to recreate or produce an indication of the amplitude of the envelope of the detected light signal over time. An example of such a re-created envelope (which may include points indicative of the amplitude or magnitude of the light signal at various points in time) that may be produced by the envelope detector 614 is illustrated in FIG. 10. In the graph of FIG. 10, the received incoming light pulse is re-created based on the signals from the TDCs 612 associated with the various thresholds $T_1$ through $T_6$. More particularly the points in the graph of FIG. 10 indicate times (on the x-axis) at which one of the amplitude detection circuits 608 of FIG. 9 measured that the detected light signal went through one of the amplitude thresholds $T_1$-$T_6$ (on the y-axis) in the rising or falling direction. The time values $t_1$ through $t_{11}$ in FIG. 10 may be referred to as temporal positions. In the graph of FIG. 10, it will be understood that the detected light signal passed through the threshold $T_1$ in a positive direction at a time $t_1$ (which is the output of the amplitude detection circuit of FIG. 9 having the comparator 610A+), passed through the threshold $T_1$ in a negative direction at a time $t_{11}$ (which is the output of the amplitude detection circuit having the comparator 610A−), passed through the threshold $T_2$ in a positive direction at a time $t_2$, (which is the output of the amplitude detection circuit having the comparator 610B+), passed through the threshold $T_2$ in a negative direction at a time $t_{10}$ (which is the output of the amplitude detection circuit having the comparator 610B−), etc. In this manner, the envelope detector 614 may recreate the values of, the amplitude of, or the envelope of the received pulse at various times by plotting the threshold values associated with the various amplitude detection circuits 608 in a chronological order as determined by the outputs of the TDCs 612 of the amplitude detection circuits 608. In some embodiments, the shape of the pulse received by the APD may not have an identical shape to the pulse recreated by the envelope detector due to variations introduced by signal processing in the photoreceiver chain.

Once the outputs of the amplitude detection circuits 608 are plotted or ordered, the envelope detector 614 may then determine, fill in, or estimate one or more characteristics of the received or detected light pulse based on these amplitude points to create a complete amplitude or magnitude envelope associated with the received, scattered light pulse or light signal. For example, the envelope detector 614 may estimate the shape of the received pulse (e.g., the dotted line in FIG. 10) by connecting the points with a curve fitting routine (which typically includes using three or more points to perform pulse envelope estimation) or with straight lines, the envelope detector 614 may determine the amplitude of the detected light pulse as the highest detected threshold value or based on a curve fitting routine, the envelope detector 614 may determine the width of the detected light pulse in some statistical manner based on the rising and falling edges of the envelope, the envelope detector 614 may determine the peak or center of the detected light pulse based on the rising and falling edges of the envelope and/or the envelope detector 614 may determine any other desired characteristics of the envelope of the detected pulse. In the case of FIG. 10, the envelope detection circuit 614 may determine that the detected light pulse is generally a sinusoidal pulse having a maximum threshold value of $T_6$.

Of course, the envelope detector 614 may determine other information regarding the detected pulse, such as the shape, width, peak, center, etc., of the pulse and may provide some or all of this information to the range detector circuit 616 of FIG. 9. In particular, the range detector circuit 616 can use various known or new techniques to detect the range of the target from which the detected pulse was reflected, based on the round trip time it took the detected pulse to return to the detector and the speed of light in the appropriate medium (e.g., air). Such a range detector circuit 616 may, for example, use the detection time associated with the rising edge, the falling edge, the peak, the center, or some other point on the detected pulse. Of course, the range detector 616 may use common mathematical techniques to determine the range to the target from the lidar system based on the detected time of receipt of the reflected pulse and the speed of light in the appropriate medium, e.g., air. For example, the range detector circuit 616 may use a detection time associated with a first threshold value crossing on a rising edge of a detected pulse and a detection time associated with a second threshold value crossing on a falling edge of the detected pulse to determine the pulse width of the detected pulse, and use a look-up table, matrix, or other data structure to determine the time of receipt based on the pulse width of the detected pulse.

As shown in FIGS. 6-10, the lidar system receives light, such as light that has been scattered or reflected by a target, at an avalanche photodiode (APD) which generates an output current that corresponds to the intensity of the received light. Although the photodetector in this embodiment is an APD, other types of photodetectors may be used. The APD output is coupled to the transimpedance amplifier (TIA) in the photoreceiver to convert the output current from the APD to a voltage output. The voltage output may then be further amplified or processed and compared against threshold voltage values to create an envelope corresponding to light received by the APD as shown in FIG. 10.

Each detected envelope may correspond to light emitted by the lidar system that has been scattered or reflected by a target back to the lidar system, and the detected envelope may be used to determine, for example, distance to the target or the amount of energy associated with the returned light. In particular embodiments, the photoreceiver of the lidar system is designed to work with a wide dynamic range of intensity from received light with very low noise. Large currents may be generated by the APD, for example, by close objects or retroreflectors. Small currents may be generated by distant objects or partially reflective objects. The photoreceiver must be sensitive enough to detect low-intensity received light that has been scattered or reflected from distant objects, as well as robust enough to withstand the high-intensity received light that has been scattered or reflected by close objects without damaging the photoreceiver. For a suitably sensitive TIA that does not have a damage protection mechanism, high-intensity received light can damage the TIA (which may also be referred to as a pre-amplifier) in the photoreceiver. For example, a resistive short may develop from the gate to drain, gate to source, or both, in the TIA input stage, which may result in device failure.

If the TIA is designed for high-intensity received light e.g. by increasing the input capacitance or using protection resistors, then the signal to noise ratio is reduced. This reduces the system's ability to detect scattered light from distant objects. As described below, in particular embodiments a protection diode circuit is added to the input of the TIA. The protection diode circuit allows for a low capacitance on the input of the TIA to maintain sensitivity sufficient to detect low-intensity received light while still protecting the TIA from high-intensity received light. As an example, the diode circuit may be a resistor or an active resistor between two diodes to reduce the required protection diode area and minimize capacitance on the input of the pre-amplifier.

The transimpedance amplifier may include a cascode circuit. In particular embodiments for a CMOS (Complementary Metal Oxide Semiconductor) TIA with cascode, a clamping diode may be added between the common source input node and the intermediate node of the cascode. The clamping diode prevents high currents generated by the APD from inducing an overvoltage event on the gate-to-source and gate-to-drain nodes of the common source stage. This protects circuits that, for example, use a thin oxide MOSFET (Metal Oxide Semiconductor Field Effect Transistor) for the common source stage of the TIA.

Figure 11:
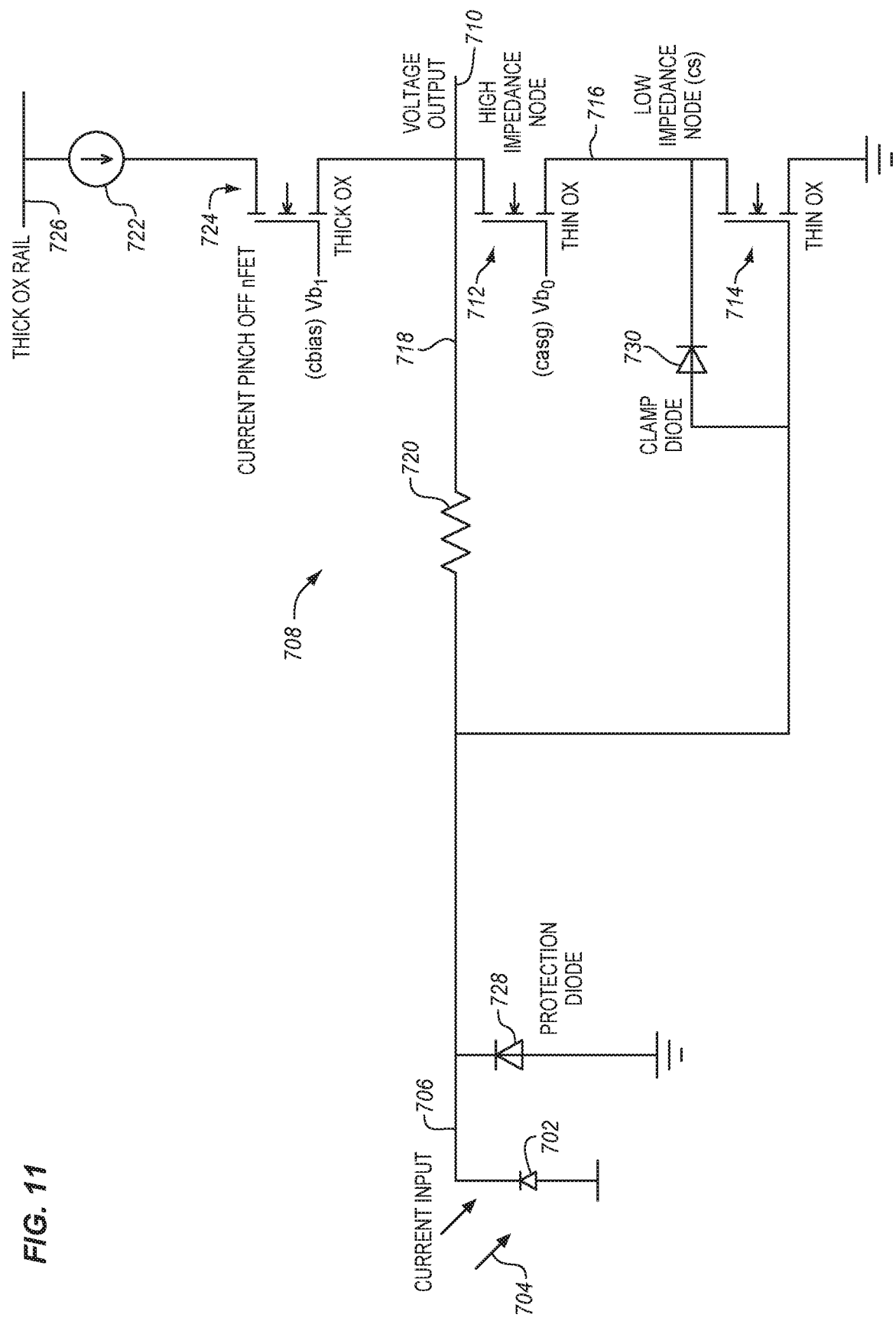
FIG. 11 illustrates a circuit with protection for an amplifier.

FIG. 11 is a circuit diagram of a portion of the transimpedance amplifier (TIA), also referred to in variations as a preamplifier, which in particular embodiments may correspond to the TIA 510 of FIG. 7. A photoreceiver of a lidar system has a photodetector 702 that receives incident light 704, such as light received by the lidar system after being scattered from a target, although the photoreceiver may be used in other types of detection systems. The photodetector output current 706 serves as a current input to a TIA 708 that generates an output voltage 710 for a gain module and comparator, for example.

In particular embodiments, the TIA portion of the circuit 708 is in the form of a cascode having two stages. The first stage is called the input stage or common source (CS) stage 714, and the second stage is a cascode or common gate (CG) stage 712. Both devices 712, 714 of the TIA 708 in this example are in the form of a thin oxide nFET (n-type Field Effect Transistor) to reduce capacitance in the APD output current 706, although other configurations and characteristics may be preferred. The CS stage 714 is a transconductance amplifier with a source coupled to ground and a drain coupled to the source of the CG stage 712. This connection is at an intermediate low impedance node 716 between the two stages. The drain of the CG stage is the voltage output node 710 of the TIA. The CG stage has a gate coupled to a regulated cascode gate voltage labeled as $Vb_0$. The CG stage is coupled between a high impedance node at the voltage output 710 and a low impedance node 716 between the cascode device and the input stage and presents a low capacitance to the input node for a larger open loop gain.

A local bias circuit may be used to generate the regulated gate voltage $Vb_0$ to bias the CG stage. The gate voltage $Vb_0$ is used to keep the two devices 712, 714 in the correct region of operation.

The gate of CS stage 714 is coupled to a feedback line 718 through feedback circuit 720, where in particular embodiments the feedback circuit is a resistor. The feedback circuit 720 is coupled on one side to the current input 706 and on the other side to the voltage output node 710.

The TIA is powered by a current source 722 that supplies current from a voltage rail 726 to the drain of the CG stage. This current is designed to provide the desired voltage in the particular circuit implementation. In particular embodiments, a current pinch-off device 724 is coupled between the current source and the CG stage to limit the maximum current supplied to the preamplifier and to limit the maximum voltage on the voltage output node 710 and the low impedance node 716. In particular embodiments, this device may be a thick oxide nFET connected so that the drain is coupled to the current source and the source is coupled to the drain of the CG stage at the high impedance node 710. In such a configuration, the gate controls the current pinch-off based on the gate bias voltage $Vb_1$.

The TIA and the downstream components, e.g. the amplifier, comparator, and TDC, have a maximum input voltage that in some embodiments is typically between 1 V and 2 V. The gate bias voltage $Vb_1$ can be configured to track changes in the threshold voltages of the amplifier devices 712, 714, and 724 in order to keep the voltage below the maximum input voltage. In this way, the current pinch-off device protects the transimpedance amplifier and downstream components from overvoltage conditions.

An input protection diode 728 may be coupled to the output of the photodetector to protect the TIA from high currents. The diode cathode is coupled to the output node of the APD 702 at one end. The diode anode is grounded. Although the diode is connected directly to ground in the illustrated embodiments, in other embodiments the diode anode may be coupled indirectly to a ground through one or more additional components. The diode 728 serves as input protection for the TIA and sinks current from the APD to ground when the output current from the photodetector is high, which causes the voltage at the cathode of the diode to exceed the diode barrier voltage. The diode provides a current away from the TIA input to protect the sensitive TIA input stage 714. The diode is configured to have a barrier voltage that is selected to be below a damage threshold of the TIA, and in some embodiments, below a damage threshold of the CS stage 914. The output current generated by the APD may be high for a variety of reasons, but a high current may commonly occur when the output laser strikes a nearby highly-reflective object, but can be caused by other particularly reflective or illuminated objects or by other light sources in the field of view. Sinking these occasional high currents allows the amplifier to be made more sensitive while still protecting the amplifier from damage.

The amplifier is further protected by a clamping diode 730 with a cathode coupled to the low impedance intermediate node of the amplifier and an anode coupled to the gate node of the CS stage 714. Under small signals the diode is reverse biased. With large signals the diode barrier voltage is exceeded and the forward current is turned on. The forward current helps keep the delta voltage between the gate and the intermediate node, as well as between the gate and ground, within a safe voltage range. The selected overvoltage depends on the characteristics of the diode and is typically below the maximum input voltage of between 1 V and 2 V. The clamping diode will allow a forward current flow to prevent an overvoltage above the selected maximum input voltage between the gate node and the intermediate node. The clamping diode 730 protects this amplifier in particular and may also protect other coupled devices.

Figure 12:
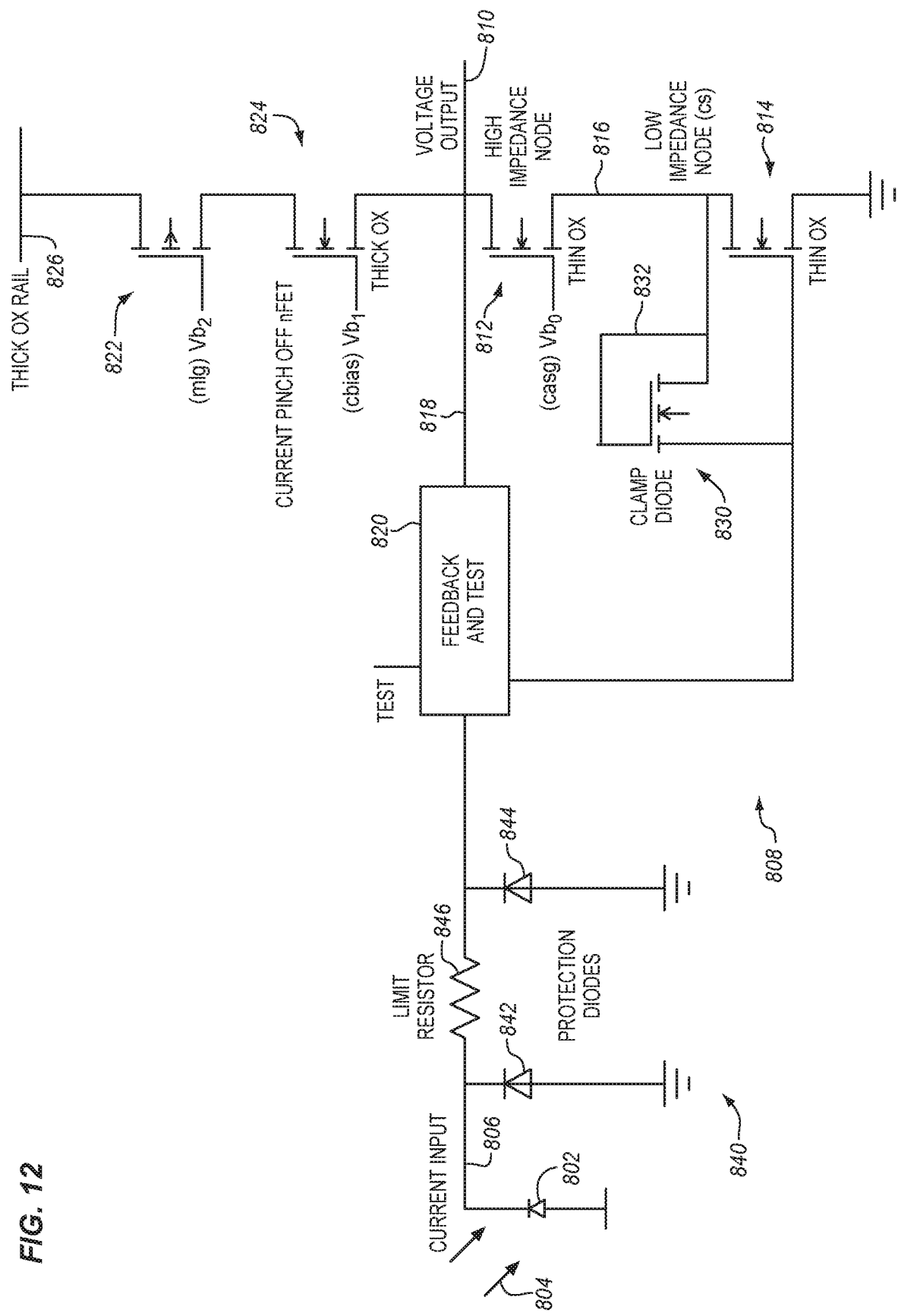
FIG. 12 illustrates an alternative circuit with protection for an amplifier.

FIG. 12 is an alternative circuit diagram of a portion of a TIA suitable for use in the applications described above. In particular embodiments, an APD 802 generates current when struck by incident light 804, such as laser emissions retro-reflected by an object in front of the laser emitter. The magnitude of the output current from the APD varies with the intensity of the incident light. The output current from the APD is input to a transimpedance amplifier (TIA) 808. The TIA has a cascode with two stages. The first stage is called the input stage or common source (CS) stage 814, and the second stage is a cascode or common gate (CG) stage 812. The CS stage 814 is between the intermediate node and ground. The voltage output node 810 is coupled through a feedback line 818 from the drain of the CG stage 812 through the feedback and test circuit logic 820 to both the input node 806 and the gate of the CS stage 814. As in the other examples, the TIA generates an output voltage 810 that tracks the input current 806. The feedback and test logic allows for many additional test, maintenance, and calibration functions to be provided.

The current source in particular embodiments is in the form of a thick oxide pFET switch 822 coupled between a higher voltage rail 826 and the drain of the CG stage 812 of the TIA. The switch is regulated by a controlled voltage $Vb_2$ which is higher than the current pinch off bias $Vb_1$.

In addition, a current pinch-off circuit implemented as a regulated nFET 824 between the current source 822 and the drain of the CG stage 812 pinches off excess currents from the current source 822 by shutting off current when the voltage on the TIA output 810 is too high. This overvoltage protection device operates similarly to the current pinch-off FET described in the context of FIG. 11.

In particular embodiments, an input protection diode circuit 840 is in the form of two parallel diodes 842, 844, each with grounded anodes and with cathodes coupled to the readout circuit output node 806 which corresponds to the photo-detector 802 cathode. The two parallel protection diodes may be similar in size to full ESD (Electro-Static Discharge) protection diodes. These diodes help sink current from the APD cathode under large signal conditions.

The cathodes of the two diodes, 842, 844 are connected across an isolating current limit resistor 846. The resistor causes a small voltage difference between the two diode cathodes. As a result, the current first sinks through the diode 842 closest to the APD 802 and before the resistor 846. The isolating resistor 846 also helps to prevent large currents from flowing toward the sensitive input transistor 814 of the TIA. As the voltage on the APD output rises, the first diode 842 will provide a current path to ground before the second diode 844. As the voltage on the APD output continues to rise, the barrier voltage at the second diode 844 will also be exceeded causing a second current path to ground to further ensure protection of the TIA input path. The resistor (or active resistor) between the two diodes also reduces the required protection diode area and minimizes capacitance on the input of the pre-amplifier. In particular embodiments, the second diode 844 may be configured with the same barrier voltage as the first diode 842. In other embodiments, the second diode may be configured with a higher barrier voltage than the first diode. This complements the effect of the isolating resistor in causing the first diode to absorb most of the overvoltages.

The amplifier is further protected by a clamping diode 830. In particular embodiments, the clamping diode is implemented as a diode-connected nFET, coupled between the low impedance intermediate node 816 of the amplifier and the input node of the CS stage 814. The diode connected FET has the drain and gate coupled to the intermediate node and the source coupled gate of the CS stage 714. The clamping diode will allow a current flow to prevent an overvoltage above the selected maximum input voltage between the input node of the CS stage 814 and the intermediate node 816. The clamping diode 830 regulates the intermediate node 816 of the TIA by shunting over voltages back to the input node of the input stage 714.

FIG. 13 is another alternative circuit diagram of a TIA with protection circuits. As in the prior examples, the TIA 908 is in the form of a cascode with an input or CS stage 914 and a cascode or CG stage 912. APD 902 generates output current 906 when struck by incident light 904, such as laser emissions retro-reflected by an object in front of the laser emitter. The magnitude of the output current 906 from the APD varies with the intensity of the incident light. The output current 906 is directed to the input device 914. The drain from the input stage 914 is coupled to the source of the cascode stage 912 at an intermediate node 916. The cascode stage generates a voltage output at its drain 910 that tracks the input current 906. A feedback line 918 from the voltage output node 910 is coupled to a feedback circuit 920 which may be as simple as a resistor. The TIA 908 is fed by a current source 922 coupled to a supply voltage 926.

The TIA 908 is protected from the current source 922 by a current pinch-off circuit 924 as described above. The TIA is also protected by a diode input circuit 940. The TIA is also protected by clamp diodes 930, 934.

A clamping diode 930 is coupled between the intermediate node 916 of the cascode chain and the input stage 914 input gate as discussed above. A second parallel diode 934 in the reverse direction with the anode coupled to the intermediate node and the cathode coupled to the input gate of the input stage 914 helps to protect against current in the opposite direction. As shown, the two clamp diodes 930, 934 are connected in parallel but in opposite directions. While these are shown as simple diodes, as an example, one or both may be implemented as diode-connected FETs as in FIG. 12 or as another type of MOS diode.

Three different protection circuits are described herein and in several variations, a clamping diode 830, a current pinch-off switch 824 and a protection diode circuit 840. While these are shown in combination in FIGS. 11 and 12. Each one may be used without the others or with only one of the others. Accordingly, the clamping diode may be sufficient to protect the TIA and used without the current pinch-off switch or the protection diode circuit. Similarly, the protection diode circuit may be sufficient to protect the TIA and used without the clamping diode or the current pinch-off switch. Similarly, the current pinch-off switch may be sufficient to protect the TIA and used without the protection diode circuit or the clamping diode.

The described receiver and associated circuitry may take any suitable physical form, including part of an embedded computer system, a system-on-chip (SOC), a single-board computer system (SBC), or any suitable combination of two or more of these. As another example, all or part of the receiver may be combined with, coupled to, or integrated into a variety of devices, including, but not limited to, a camera, vehicle display (e.g., odometer display or dashboard display), vehicle navigation system, lidar system, ADAS, autonomous vehicle, autonomous-vehicle driving system, cockpit control, camera view display (e.g., display of a rear-view camera in a vehicle), eyewear, or head-mounted display. Where appropriate, the receiver may be part of one or more computer systems that are unitary or distributed; span multiple locations; span multiple machines. Where appropriate, the receiver may perform without substantial spatial or temporal limitation one or more operations described or illustrated herein. As an example operations may be performed in real time or in batch mode one or more steps.

In particular embodiments, all or part of a module, circuit, system, method, or algorithm disclosed herein may be implemented or performed by a general-purpose single- or multi-chip processor, a digital signal processor (DSP), an ASIC, a FPGA, any other suitable programmable-logic device, discrete gate or transistor logic, discrete hardware components, or any suitable combination thereof. A general-purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In particular embodiments, certain features described herein in the context of separate implementations may also be combined and implemented in a single implementation. Conversely, various features that are described in the context of a single implementation may also be implemented in multiple implementations separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

While operations may be depicted in the drawings as occurring in a particular order, this should not be understood as requiring that such operations be performed in the particular order shown or in sequential order, or that all operations be performed. Further, the drawings may schematically depict one more example processes or methods in the form of a flow diagram or a sequence diagram. However, other operations that are not depicted may be incorporated in the example processes or methods that are schematically illustrated. For example, one or more additional operations may be performed before, after, simultaneously with, or between any of the illustrated operations. Moreover, one or more operations depicted in a diagram may be repeated, where appropriate. Additionally, operations depicted in a diagram may be performed in any suitable order. Furthermore, although particular components, devices, or systems are described herein as carrying out particular operations, any suitable combination of any suitable components, devices, or systems may be used to carry out any suitable operation or combination of operations. In certain circumstances, multitasking or parallel processing operations may be performed. Moreover, the separation of various system components in the implementations described herein should not be understood as requiring such separation in all implementations, and it should be understood that the described program components and systems may be integrated together in a single software product or packaged into multiple software products.

Various embodiments have been described in connection with the accompanying drawings. However, it should be understood that the figures may not necessarily be drawn to scale. As an example, distances or angles depicted in the figures are illustrative and may not necessarily bear an exact relationship to actual dimensions or layout of the devices illustrated.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes or illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend.

The term "or" as used herein is to be interpreted as an inclusive or meaning any one or any combination, unless expressly indicated otherwise or indicated otherwise by context. Therefore, herein, the expression "A or B" means "A, B, or both A and B." As another example, herein, "A, B or C" means at least one of the following: A; B; C; A and B; A and C; B and C; A, B and C. An exception to this definition will occur if a combination of elements, devices, steps, or operations is in some way inherently mutually exclusive.

As used herein, words of approximation such as, without limitation, "approximately, "substantially," or "about" refer to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as having the required characteristics or capabilities of the unmodified feature. In general, but subject to the preceding discussion, a numerical value herein that is modified by a word of approximation such as "approximately" may vary from the stated value by ±0.5%, ±1%, ±2%, ±3%, ±4%, ±5%, ±10%, ±12%, or ±15%.

As used herein, the terms "first," "second," "third," etc. may be used as labels for nouns that they precede, and these terms may not necessarily imply a particular ordering (e.g., a particular spatial, temporal, or logical ordering). As an example, a system may be described as determining a "first result" and a "second result," and the terms "first" and "second" may not necessarily imply that the first result is determined before the second result.

As used herein, the terms "based on" and "based at least in part on" may be used to describe or present one or more factors that affect a determination, and these terms may not exclude additional factors that may affect a determination. A determination may be based solely on those factors which are presented or may be based at least in part on those factors. The phrase "determine A based on B" indicates that B is a factor that affects the determination of A. In some instances, other factors may also contribute to the determination of A. In other instances, A may be determined based solely on B.

As used herein, the terms "coupled," "couple," "coupling" and similar terms may be used to describe or present a direct physical connection without any intermediate components or may refer to a connection that is through other intermediate components including resistors, capacitor, diodes, transistors, and integrated circuits. A component may also be "coupled" to another component through modulators, converters, and communications interfaces.

What is claimed is:

1. A transimpedance amplifier protection circuit comprising:
   a photoreceiver for a lidar system having a photodetector configured to generate an output current in response to received light;
   a transimpedance amplifier configured to receive the output current and generate an output voltage corresponding to the output current in response thereto;
   a protection diode circuit having a cathode coupled at an input node between the photodetector output and the transimpedance amplifier input; and
   a clamping diode coupled between the input node and an intermediate node of the transimpedance amplifier, the clamping diode configured to prevent overvoltage between the input node and the intermediate node.

2. The circuit of claim 1, wherein the protection diode circuit has a grounded anode.

3. The circuit of claim 1, wherein the protection diode circuit is configured to reduce the capacitance at the transimpedance amplifier input.

4. The circuit of claim 1, wherein the protection diode circuit has a barrier voltage above which the protection diode circuit provides a current path to ground, wherein the barrier voltage is below the damage threshold of the transimpedance amplifier.

5. The circuit of claim 1, wherein the protection diode circuit comprises a first and a second parallel diode, each with grounded anodes and each with cathodes coupled to the input node and a resistor between the two cathodes.

6. The circuit of claim 5, wherein the resistor is an active resistor.

7. The circuit of claim 5, wherein the first diode cathode is between the photodetector and the resistor and wherein the second diode has a higher barrier voltage than the first diode.

8. The circuit of claim 5, wherein the first diode cathode is between the photodetector and the resistor and wherein the first diode and second diode have equivalent barrier voltages.

9. The circuit of claim 5, wherein the resistor is configured as a current limiting resistor to reduce high currents from the photodetector to the transimpedance amplifier.

10. An active camera system, comprising:
a light source configured to emit light as a series of one or more light pulses;
a scanner configured to direct the one or more light pulses towards a remote target at a particular position in a two-dimensional field of regard; and
a receiver configured to detect one or more light pulses scattered by the remote target, the receiver including:
a photoreceiver having a photodetector configured to generate an output current in response to received light;
a transimpedance amplifier configured to receive the output current and generate an output voltage corresponding to the output current in response thereto; and
a protection diode circuit having a cathode coupled at an input node between the photodetector output and the transimpedance amplifier input; and
a clamping diode coupled between the input node and an intermediate node of the transimpedance amplifier, the clamping diode configured to prevent overvoltage between the input node and the intermediate node.

11. A method of imaging a remote target, comprising:
generating a light pulse for a position in a two-dimensional scanning field of regard;
emitting the generated light pulse toward a remote target in the position of the two-dimensional field of regard;
receiving a scattered light pulse scattered from the remote target at a photodetector and generating a current output;
generating an output voltage corresponding to the current output at a transimpedance amplifier configured to receive the photodetector output;
sinking current from the photodetector to ground when the current output exceeds a barrier voltage of a protection diode circuit having:
a grounded anode and a cathode coupled at an input node between the photodetector output and the transimpedance amplifier input; and
a clamping diode coupled between the input node and an intermediate node of the transimpedance amplifier, the clamping diode configured to prevent overvoltage between the input node and the intermediate node;
detecting a receive time associated with the received scattered light pulse;
determining a range to the target based on the receive time of the received scattered light pulse;
detecting an intensity of the received scattered light pulse; and
determining a reflectivity of the remote target from the determined range to the remote target and the detected intensity of the received scattered light pulse.

12. The circuit of claim 1, wherein the transimpedance amplifier comprises a common source stage and a common gate stage and wherein the intermediate node is between the common source stage and the common gate stage.

13. The circuit of claim 12, wherein the clamping diode is configured to prevent the overvoltage between a gate and a drain of the common source stage.

14. The circuit of claim 12, wherein the clamping diode is configured to prevent the overvoltage between a gate and a source of the common source stage.

15. The circuit of claim 1, wherein the clamping diode comprises a diode connected field effect transistor.

16. The circuit of claim 1, wherein the clamping diode has an anode coupled to the input node and a cathode coupled to the intermediate node.

17. The circuit of claim 16, wherein the clamping diode further comprises a second parallel diode having an anode coupled to the intermediate node and a cathode coupled to the input node.

18. The circuit of claim 1, further comprising:
a current source coupled to a voltage output node of the transimpedance amplifier, wherein the output voltage of the transimpedance amplifier is supplied to the voltage output node; and
a current pinch off circuit between the current source and the output node configured to pinch off a current of the current source when the output voltage exceeds a second overvoltage.

19. The circuit of claim 18, wherein the current pinch off circuit is a field effect transistor, having a regulated input bias voltage.

20. The circuit of claim 19, wherein the regulated input bias voltage is regulated based, at least in part, on threshold voltages of the transimpedance amplifier.

21. The circuit of claim 18, wherein the transimpedance amplifier comprises a cascode chain and wherein the current pinch-off circuit is coupled between the current source and the cascode chain.

* * * * *